(12) United States Patent
Gregor

(10) Patent No.: US 11,542,598 B2
(45) Date of Patent: Jan. 3, 2023

(54) SYSTEMS AND METHODS FOR PULSE WIDTH MODULATED DOSE CONTROL

(71) Applicant: LAM RESEARCH CORPORATION, Fremont, CA (US)

(72) Inventor: Mariusch Gregor, Gilroy, CA (US)

(73) Assignee: Lam Research Corporation, Fremont, CA (US)

( * ) Notice: Subject to any disclaimer, the term of this patent is extended or adjusted under 35 U.S.C. 154(b) by 385 days.

(21) Appl. No.: 16/650,328

(22) PCT Filed: Sep. 21, 2018

(86) PCT No.: PCT/US2018/052246
§ 371 (c)(1),
(2) Date: Mar. 24, 2020

(87) PCT Pub. No.: WO2019/067323
PCT Pub. Date: Apr. 4, 2019

(65) Prior Publication Data
US 2020/0270748 A1 Aug. 27, 2020

Related U.S. Application Data

(60) Provisional application No. 62/590,815, filed on Nov. 27, 2017, provisional application No. 62/563,129, filed on Sep. 26, 2017.

(51) Int. Cl.
*C23C 16/40* (2006.01)
*C23C 16/455* (2006.01)
(Continued)

(52) U.S. Cl.
CPC .......... *C23C 16/45544* (2013.01); *B05B 1/14* (2013.01); *B05B 1/30* (2013.01);
(Continued)

(58) Field of Classification Search
CPC ........ C23C 16/45544; C23C 16/45557; C23C 16/45565; C23C 16/45523; B05B 1/14;
(Continued)

(56) References Cited

U.S. PATENT DOCUMENTS 4,761,269 A * 8/1988 Conger ............. C23C 16/45561
118/679
6,197,123 B1 3/2001 Poag et al.
(Continued)

FOREIGN PATENT DOCUMENTS

WO WO-2017160614 A1 9/2017

OTHER PUBLICATIONS

International Search Report and Written Opinion issued in PCT/US2018/052246, dated Jan. 18, 2019; ISA/KR.
Extended European Search Report for European Application No. 18860772.5 dated Jun. 4, 2021.

*Primary Examiner* — Rudy Zervigon

(57) ABSTRACT

A substrate processing system for treating a substrate includes a manifold and a plurality of injector assemblies located in a processing chamber. Each of the plurality of injector assemblies is in fluid communication with the manifold and includes a valve including an inlet and an outlet. A dose controller is configured to communicate with the valve in each of the plurality of injector assemblies and adjust a pulse width supplied to the valve in each of the plurality of injector assemblies based on at least one of manufacturing differences between the valves in each of the plurality of injector assemblies and non-uniformities of the valves in each of the plurality of injector assemblies to cause a desired dose to be supplied from the valve in each of the plurality of injector assemblies.

16 Claims, 20 Drawing Sheets

(51) Int. Cl.
*B05B 1/14* (2006.01)
*B05B 1/30* (2006.01)
*H01L 21/67* (2006.01)

(52) U.S. Cl.
CPC ............... *C23C 16/45557* (2013.01); *C23C 16/45565* (2013.01); *H01L 21/67069* (2013.01); *H01L 21/67253* (2013.01)

(58) Field of Classification Search
CPC .............. B05B 1/30; H01L 21/67069; H01L 21/67253; H01L 21/67017; H01L 21/67028; H01L 21/6719; H01L 21/67276; H01L 21/67248; H01J 37/32449
USPC ............... 118/715, 728; 156/345.33, 345.34
See application file for complete search history.

(56) References Cited

U.S. PATENT DOCUMENTS

| | | | |
|---|---|---|---|
| 10,403,476 | B2 | 9/2019 | Gregor et al. |
| 2002/0042205 | A1 | 4/2002 | McMillin et al. |
| 2004/0040502 | A1* | 3/2004 | Basceri ............ C23C 16/45574 118/715 |
| 2004/0040503 | A1* | 3/2004 | Basceri ............ C23C 16/45531 118/715 |
| 2006/0150432 | A1 | 7/2006 | Pham |
| 2006/0216417 | A1 | 9/2006 | Todd et al. |
| 2008/0202588 | A1 | 8/2008 | Gold et al. |
| 2010/0255658 | A1 | 10/2010 | Aggarwal et al. |
| 2012/0156363 | A1 | 6/2012 | Quinn et al. |
| 2014/0261805 | A1* | 9/2014 | Nangoy ................... H01L 21/00 137/599.09 |
| 2018/0130640 | A1 | 5/2018 | Gregor et al. |
| 2021/0010137 | A1* | 1/2021 | Su .................... H01J 37/32449 |

* cited by examiner

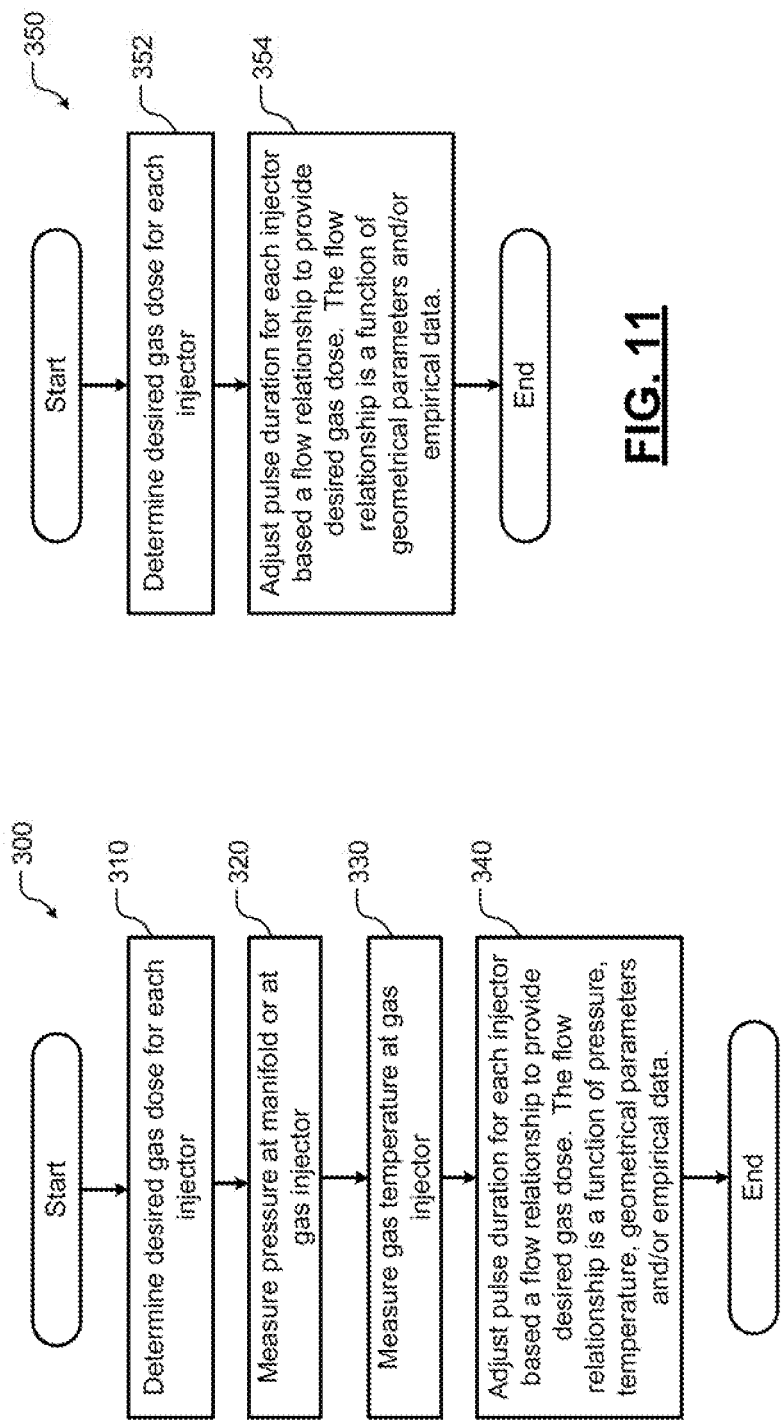

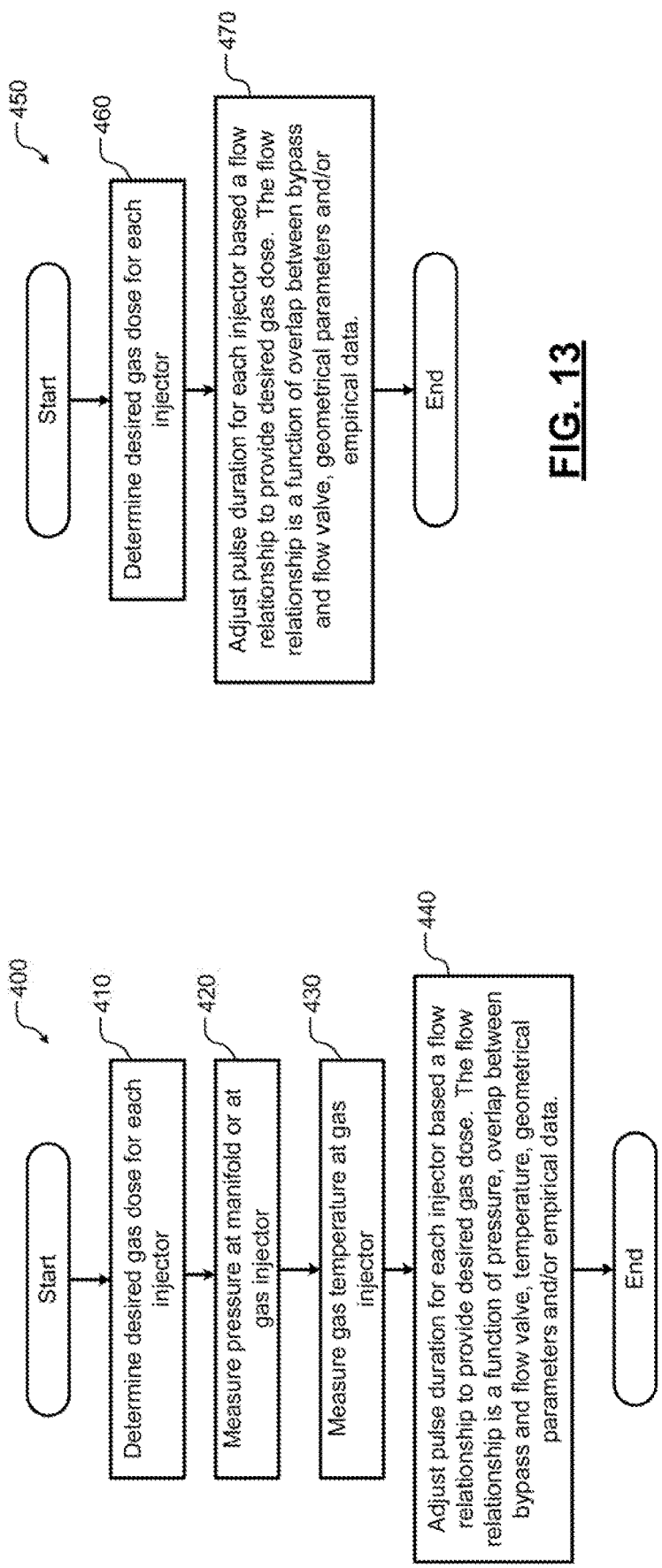

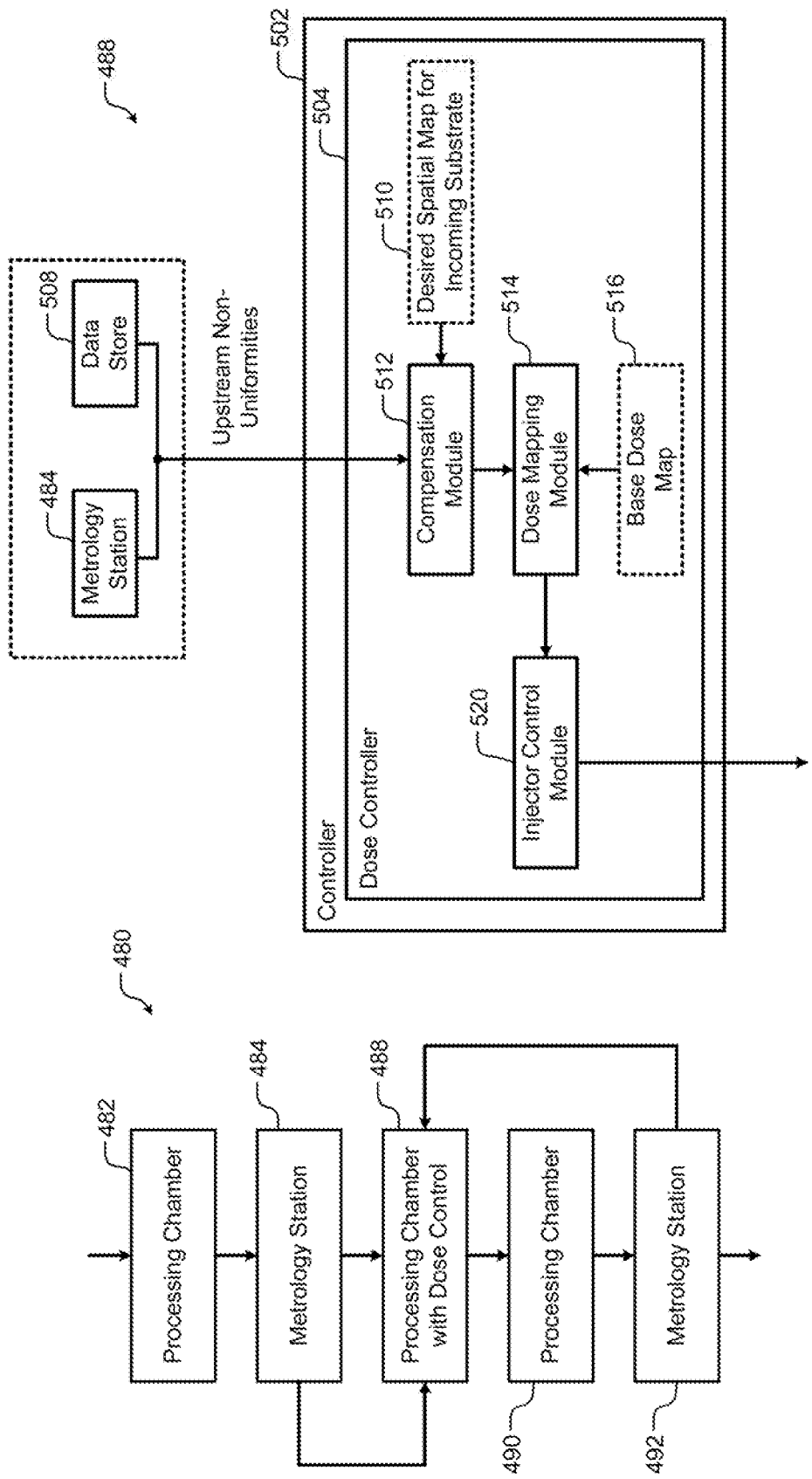

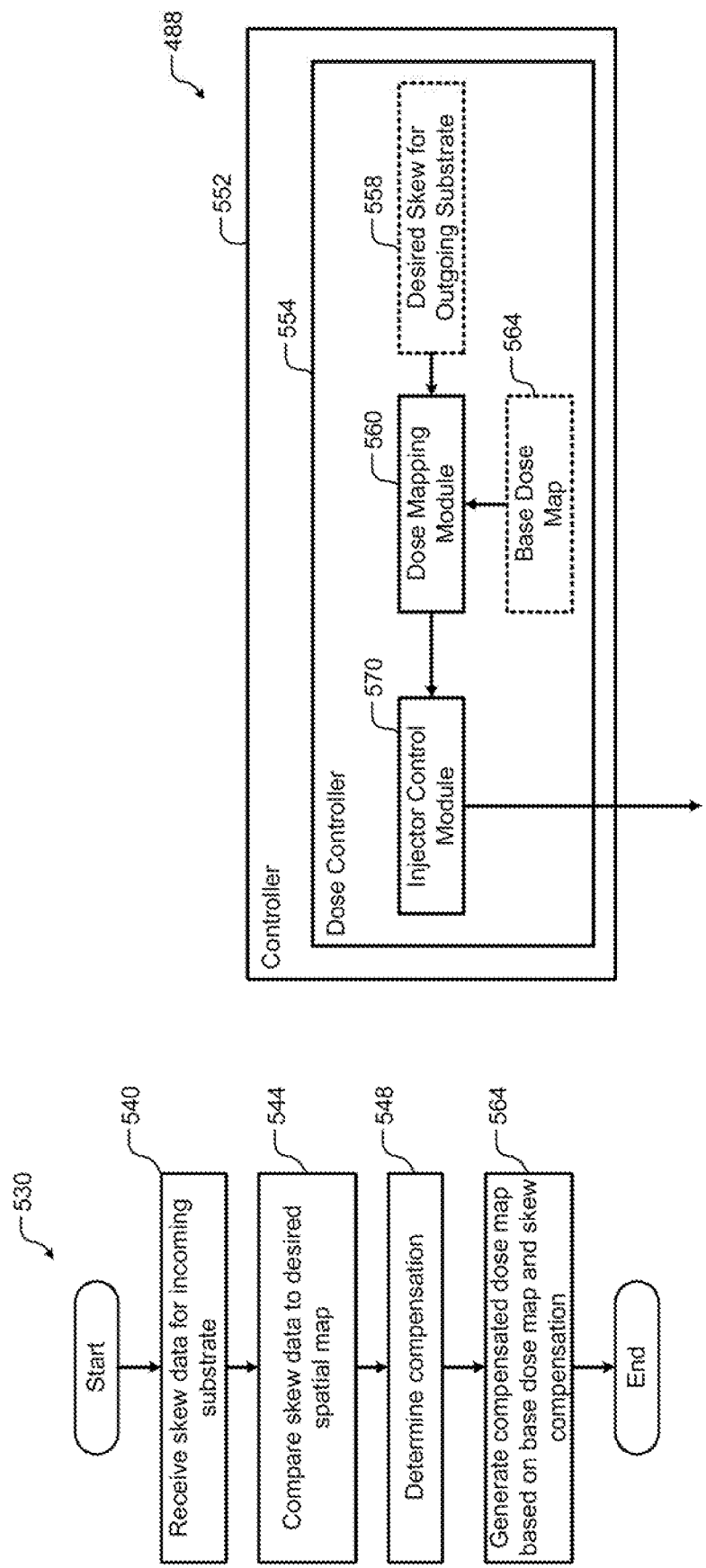

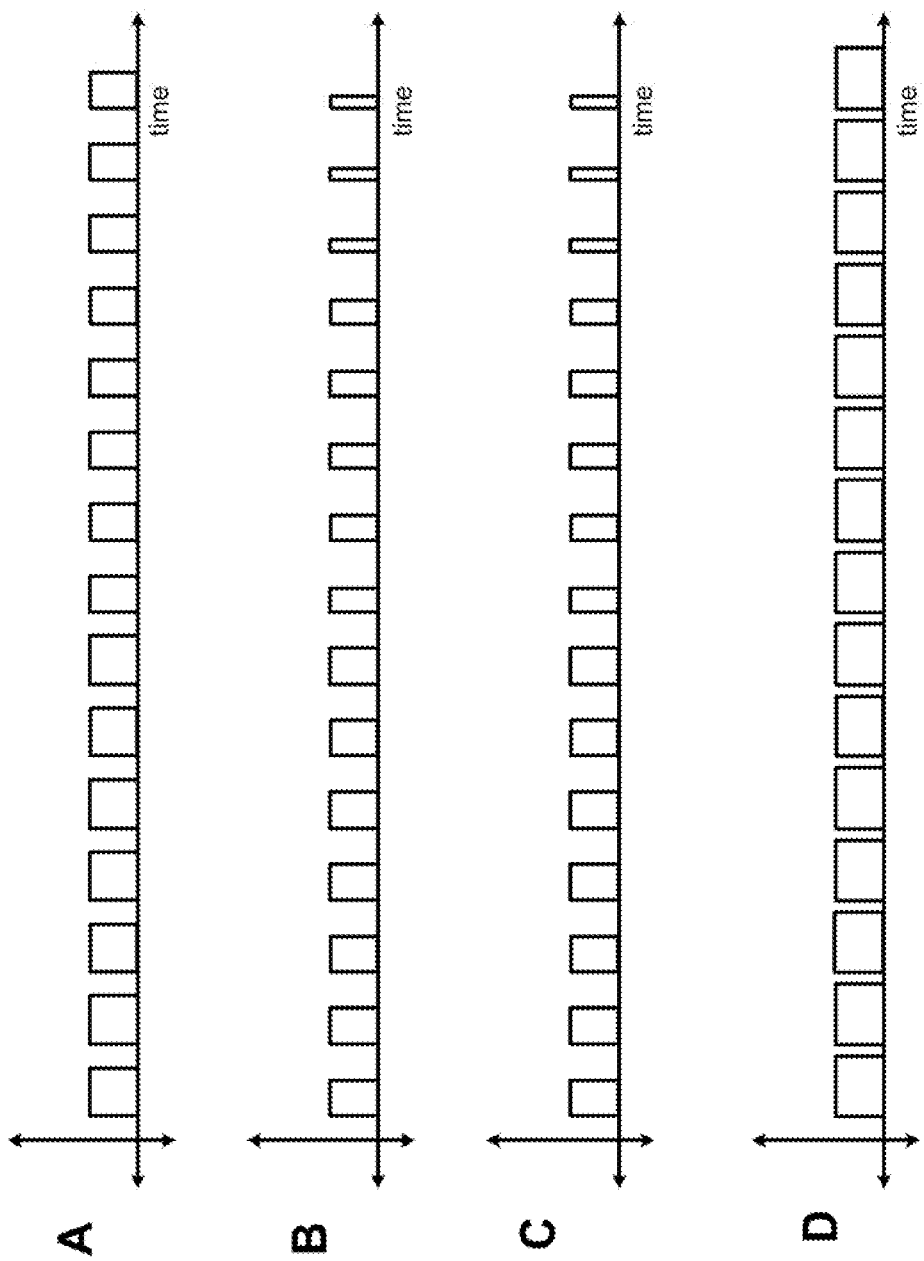

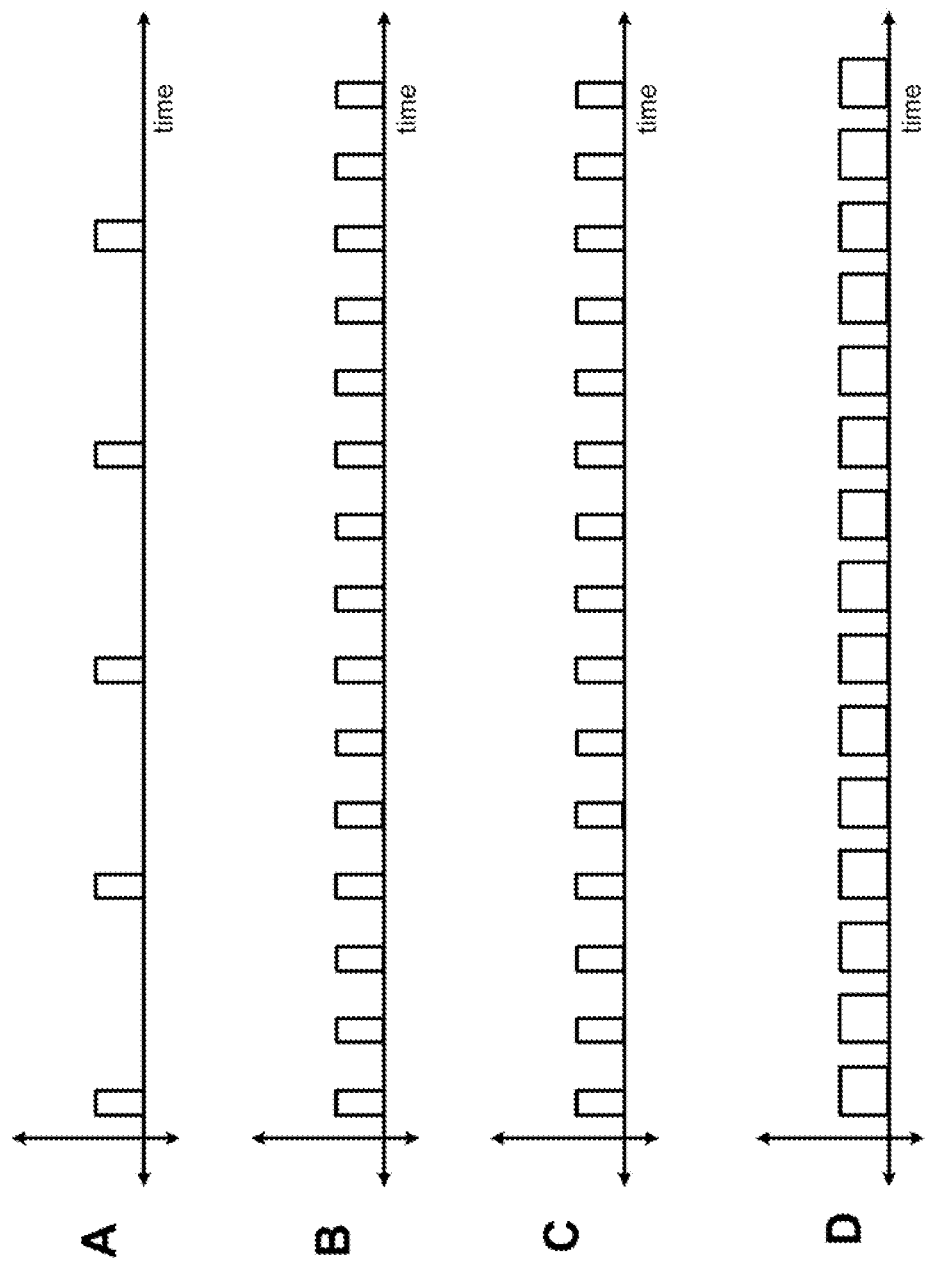

SYSTEMS AND METHODS FOR PULSE WIDTH MODULATED DOSE CONTROL

CROSS-REFERENCE TO RELATED APPLICATIONS

This application is a 371 U.S. Nationa Phase of International Application No. PCT/US2018/052246, filed on Sep. 21, 2018, which claims the benefit of U.S. Provisional Application No. 62/590,815, filed on Nov. 27, 2017 and U.S. Provisional Application No. 62/563,129, filed on Sep. 26, 2017. The entire disclosures of the applications referenced above are incorporated herein by reference.

FIELD

The present disclosure relates to substrate processing systems, and more particularly to substrate processing systems with pulse width modulated dose control.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Examples of substrate treatments include etching, deposition, photoresist removal, etc. During processing, the substrate is arranged on a substrate support such as an electrostatic chuck and one or more process gases may be introduced into the processing chamber.

The one or more processing gases may be delivered by a gas delivery system to the processing chamber. In some systems, the gas delivery system includes a manifold connected by one or more conduits to a showerhead that is located in the processing chamber. Most gas delivery systems deliver gases during periods that are longer than 5 or 10 seconds. Latency caused by mixing in the manifold, delivery through the conduits, and flow resistance of the showerhead makes it difficult to change gas mixtures quickly or to vary gas doses spatially or temporally. Furthermore, gas mixtures may react during travel through the gas delivery system. Some processes such as atomic layer etching (ALE), atomic layer deposition (ALD), etc. require different gas mixtures to be delivered to the processing chamber during very short intervals that are typically less than a second or a few seconds.

SUMMARY

A substrate processing system for treating a substrate includes a manifold and a plurality of injector assemblies located in a processing chamber. Each of the plurality of injector assemblies is in fluid communication with the manifold and includes a valve including an inlet and an outlet. A dose controller is configured to communicate with the valve in each of the plurality of injector assemblies and adjust a pulse width supplied to the valve in each of the plurality of injector assemblies based on at least one of manufacturing differences between the valves in each of the plurality of injector assemblies and non-uniformities of the valves in each of the plurality of injector assemblies to cause a desired dose to be supplied from the valve in each of the plurality of injector assemblies.

In other features, each of the plurality of injector assemblies further includes a pressure sensor sensing pressure at the valve in each of the plurality of injector assemblies. The dose controller is configured to adjust the respective pulse width for each valve based on the corresponding sensed pressure. Each of the plurality of injector assemblies further includes a temperature sensor sensing gas temperature at the valve in each of the plurality of injector assemblies. The dose controller is configured to adjust the respective pulse width for each valve based on the corresponding sensed gas temperature.

In other features, the dose controller is configured to vary the pulse widths based on corresponding locations of the plurality of injector assemblies relative to the substrate. The dose controller is configured to vary the pulse widths based on corresponding empirical data for the plurality of injector assemblies. A pressure regulator regulates a pressure inside the manifold. The dose controller is configured to adjust the pulse widths so as to cause the valves to provide approximately the same dose. The dose controller is configured to adjust the pulse widths so as to cause the valves to provide different doses. Each of the plurality of injector assemblies further includes a restricted orifice. Each of the plurality of injector assemblies further includes a bypass valve having an inlet connected to the inlet of the valve.

In other features, each of the plurality of injector assemblies further includes a pressure sensor sensing pressure at the corresponding valve in each of the plurality of injector assemblies. The dose controller is configured to adjust the pulse widths for the valves and the bypass valves based on the corresponding sensed pressures. Each of the plurality of injector assemblies further includes a temperature sensor sensing gas temperature at the corresponding valve in each of the plurality of injector assemblies. The dose controller is configured to adjust the pulse widths for the valves and the bypass valves based on the corresponding sensed gas temperatures.

In other features, the dose controller is configured to vary the respective pulse width based on a desired overlap of the valve and the bypass valve for each of the plurality of injector assemblies. The dose controller is configured to vary doses output by the plurality of injector assemblies to provide spatial skew.

A substrate processing system for treating a substrate includes a manifold and a plurality of injector assemblies located in a processing chamber. Each of the plurality of injector assemblies is in fluid communication with the manifold and includes a valve including an inlet and an outlet. A dose controller is configured to communicate with the valve in each of the plurality of injector assemblies, adjust a pulse width supplied to the valve in each of the plurality of injector assemblies to provide spatial dosing and at least one of compensate for upstream skew caused by a prior process and pre-compensate for downstream skew expected from a subsequent process.

In other features, each of the plurality of injector assemblies further includes a pressure sensor sensing pressure at the valve in each of the plurality of injector assemblies. The dose controller is configured to adjust the pulse widths based on the corresponding pressures. Each of the plurality of injector assemblies further includes a temperature sensor sensing gas temperature at the valve in each of the plurality of injector assemblies. The dose controller is configured to adjust the pulse widths based on the corresponding gas temperatures.

In other features, the dose controller is configured to vary the pulse widths based on at least one of manufacturing differences between the valves in each of the plurality of injector assemblies and non-uniformities of the valves in each of the plurality of injector assemblies. A pressure regulator regulates a pressure inside the manifold. Each of the plurality of injector assemblies further includes a restricted orifice. Each of the plurality of injector assemblies further includes a bypass valve having an inlet connected to an inlet of the valve. Each of the plurality of injector assemblies further includes a pressure sensor sensing pressure at the valve in each of the plurality of injector assemblies. The dose controller is configured to adjust the pulse widths of the valves and the bypass valves based on the corresponding pressures.

In other features, each of the plurality of injector assemblies further includes a temperature sensor sensing gas temperature at the valve in each of the plurality of injector assemblies. The dose controller is configured to adjust the pulse widths of the valves and the bypass valves based on the corresponding gas temperatures. The dose controller is configured to vary the pulse widths based on a desired overlap of the valve and the bypass valve for each of the plurality of injector assemblies.

In other features, the dose controller is configured to vary doses output by the plurality of injector assemblies to provide spatial skew.

A substrate processing system for treating a substrate includes N manifolds and Y groups of injector assemblies, wherein Y and N are integers greater than one. Each of the Y groups of injector assemblies includes N injector assemblies located in a processing chamber. Each of the N injector assemblies in each group of injector assemblies is in fluid communication with one of the N manifolds, respectively, and includes a valve including an inlet and an outlet. A dose controller is configured to control pulse widths output to the Y groups of injector assemblies to provide temporal dosing of the substrate.

In other features, the temporal dosing includes supplying a first gas mixture from a first one of the N manifolds using a first one of the Y groups of injector assemblies while concurrently supplying a second gas mixture from a second one of the N manifolds using a second one of the Y groups of injector assemblies.

In other features, each of the N injector assemblies further includes a pressure sensor sensing pressure at the valve in each of the N injector assemblies. The dose controller is configured to adjust the pulse widths based on the corresponding sensed pressures. Each of the N injector assemblies further includes a temperature sensor sensing gas temperature at the valve in each of the N injector assemblies. The dose controller is configured to adjust the pulse widths based on the corresponding gas temperatures.

In other features, the dose controller is configured to vary the pulse widths based on at least one of manufacturing differences between the valves in each of the N injector assemblies and non-uniformities of the valves in each of the N injector assemblies. A pressure regulator regulates a pressure inside the manifold.

In other features, each of the N injector assemblies further includes a restricted orifice. Each of the N injector assemblies further includes a bypass valve having an inlet connected to an inlet of the valve. Each of the N injector assemblies further includes a pressure sensor sensing pressure at the valve in each of the N injector assemblies. The dose controller is configured to adjust the pulse widths of the valves and the bypass valves based on the corresponding pressures.

In other features, each of the N injector assemblies further includes a temperature sensor sensing gas temperature at the valve in each of the N injector assemblies. The dose controller is configured to adjust the pulse widths of the valves and the bypass valves based on the corresponding gas temperatures.

In other features, the dose controller is configured to vary the pulse widths based on a desired overlap of the valve and the bypass valve for each of the N injector assemblies.

A substrate processing system for treating a substrate includes a manifold to supply a main gas flow and a plurality of injector assemblies located in a processing chamber. Each of the plurality of injector assemblies is in fluid communication with the manifold and includes a valve including an inlet and an outlet. A dose controller is configured to define R groups each including at least one of the plurality of injector assemblies, where R is an integer greater than one; communicate with the valves in each of the R groups; and split the main gas flow into R gas flows corresponding to R predefined flow ratios of the main gas flow by adjusting pulse widths that are output to the valves associated with the R groups, respectively. At least one of the R predefined flow ratios is different than another one of the R predefined flow ratios.

In other features, each of the plurality of injector assemblies further includes a pressure sensor sensing pressure at the valve in each of the plurality of injector assemblies. The dose controller is configured to adjust the pulse widths based on the corresponding pressures. Each of the plurality of injector assemblies further includes a temperature sensor sensing gas temperature at the valve in each of the plurality of injector assemblies. The dose controller is configured to adjust the pulse widths based on the corresponding gas temperatures.

In other features, the dose controller is configured to vary the pulse widths based on at least one of manufacturing differences between the valves in each of the plurality of injector assemblies and non-uniformities of the valves in each of the plurality of injector assemblies. A pressure regulator regulates a pressure inside the manifold.

In other features, each of the plurality of injector assemblies further includes a restricted orifice. Each of the plurality of injector assemblies further includes a bypass valve having an inlet connected to an inlet of the valve. Each of the plurality of injector assemblies further includes a pressure sensor sensing pressure at the valve in each of the plurality of injector assemblies. The dose controller is configured to adjust the pulse widths of the valves and the bypass valves based on the corresponding pressures.

In other features, each of the plurality of injector assemblies further includes a temperature sensor sensing gas temperature at the valve in each of the plurality of injector assemblies. The dose controller is configured to adjust the pulse widths of the valves and the bypass valves based on the corresponding gas temperatures.

In other features, the dose controller is configured to vary the pulse widths based on a desired overlap of the valve and the bypass valve for each of the plurality of injector assemblies. The dose controller is configured to vary doses output by the plurality of injector assemblies to provide spatial skew.

A method for supplying fluid to a substrate processing system for treating a substrate includes arranging a plurality of injector assemblies, each including a valve including an inlet and an outlet, in a processing chamber; coupling the plurality of injector assemblies to a manifold; and adjusting a pulse width supplied to the valve in each of the plurality of injector assemblies based on at least one of manufacturing differences between the valves in each of the plurality of injector assemblies, and non-uniformities of the valves in each of the plurality of injector assemblies to supply a desired dose from the valve in each of the plurality of injector assemblies.

In other features, the method includes sensing pressure at the valve in each of the plurality of injector assemblies. The method includes adjusting the pulse widths further based on the corresponding pressures. The method includes sensing gas temperature at the valve in each of the plurality of injector assemblies. The method includes adjusting the pulse widths further based on the corresponding gas temperatures. The method includes varying the pulse widths further based on corresponding locations of the plurality of injector assemblies relative to the substrate.

In other features, the method includes varying the pulse widths further based on corresponding empirical data for the plurality of injector assemblies. The method includes regulating a pressure inside the manifold. The method includes adjusting the pulse width corresponding to each of the plurality of injector assemblies to provide approximately the same dose. The method includes adjusting the pulse width corresponding to each of the plurality of injector assemblies to provide different doses. Each of the plurality of injector assemblies further includes a restricted orifice. Each of the plurality of injector assemblies further includes a bypass valve having an inlet connected to an inlet of the valve.

In other features, the method includes sensing pressure at the valve in each of the plurality of injector assemblies and adjusting the pulse widths of the valves and the bypass valves further based on the corresponding pressures.

In other features, the method includes sensing gas temperature at the valve in each of the plurality of injector assemblies and adjusting the pulse widths of the valves and the bypass valves further based on the corresponding gas temperatures.

In other features, the method includes varying the pulse widths further based on a desired overlap of the valve and the bypass valve for each of the plurality of injector assemblies. The method includes varying doses output by the plurality of injector assemblies to provide spatial skew.

A method for supplying fluid in a substrate processing system for treating a substrate includes arranging a plurality of injector assemblies, each including a valve including an inlet and an outlet, in a processing chamber; coupling the plurality of injector assemblies to a manifold; and adjusting a pulse width supplied to the valve in each of the plurality of injector assemblies to provide spatial dosing and at least one of compensate for upstream skew caused by a prior process and pre-compensate for downstream skew expected from a subsequent process.

In other features, the method includes sensing pressure at the valve in each of the plurality of injector assemblies. The method includes adjusting the pulse widths further based on the corresponding pressures. The method includes sensing gas temperature at the valve in each of the plurality of injector assemblies. The method includes adjusting the pulse widths further based on the corresponding gas temperatures.

In other features, the method includes varying the pulse widths further based on at least one of manufacturing differences between the valves in each of the plurality of injector assemblies and non-uniformities of the valves in each of the plurality of injector assemblies. The method includes regulating pressure inside the manifold. In other features, each of the plurality of injector assemblies further includes a restricted orifice. In other features, each of the plurality of injector assemblies further includes a bypass valve having an inlet connected to an inlet of the valve.

In other features, the method includes sensing pressure at the valve in each of the plurality of injector assemblies and adjusting the pulse widths of the valves and the bypass valves further based on the corresponding pressures. The method includes sensing gas temperature at the valve in each of the plurality of injector assemblies and adjusting the pulse widths of the valves and the bypass valves further based on the corresponding gas temperatures.

In other features, the method includes varying the pulse widths further based on a desired overlap of the valve and the bypass valve for each of the plurality of injector assemblies. The method includes varying doses output by the plurality of injector assemblies to provide spatial skew.

A method for supplying fluid to a substrate processing system for treating a substrate includes arranging Y groups of injector assemblies in a processing chamber. Each of the Y groups of injector assemblies includes N injector assemblies. The method includes coupling each of the N injector assemblies of the Y groups of injector assemblies to one of N manifolds, respectively. Each of the N injector assemblies includes a valve including an inlet and an outlet, where Y and N are integers greater than one. The method includes controlling pulse widths output to the Y groups of injector assemblies to provide temporal dosing of the substrate.

In other features, providing the temporal dosing includes supplying a first gas mixture from one of the N manifolds using one of the Y groups of injector assemblies at the same time that a different gas mixture is supplied from another one of the N manifolds using another one of the Y groups of injector assemblies. The method includes sensing pressure at the valve in each of the N injector assemblies. The method includes adjusting the pulse widths further based on the corresponding pressures. The method includes sensing gas temperature at the valve in each of the N injector assemblies. The method includes adjusting the pulse widths further based on the corresponding gas temperatures.

In other features, the method includes varying the pulse widths further based on at least one of manufacturing differences between the valves in each of the N injector assemblies and non-uniformities of the valves in each of the N injector assemblies. The method includes regulating a pressure inside the manifold. Each of the N injector assemblies further includes a restricted orifice. Each of the N injector assemblies further includes a bypass valve having an inlet connected to an inlet of the valve.

In other features, the method includes sensing pressure at the valve in each of the N injector assemblies and adjusting the pulse widths of the valves and the bypass valves further based on the corresponding pressures. The method includes sensing gas temperature at the valve in each of the N injector assemblies and adjusting the pulse widths of the valves and the bypass valves further based on the corresponding gas temperatures.

In other features, the method includes varying the pulse widths further based on a desired overlap of the valve and the bypass valve for each of the N injector assemblies.

A method for supplying fluid to a substrate processing system for treating a substrate includes supplying a main gas flow using a manifold and arranging a plurality of injector assemblies in a processing chamber. Each of the plurality of injector assemblies is in fluid communication with the manifold and includes a valve including an inlet and an outlet. The method includes defining R groups each including at least one of the plurality of injector assemblies, where R is an integer greater than one; communicating with the valves in each of the R groups; and splitting the main gas flow into R gas flows corresponding to R predefined flow ratios of the main gas flow by adjusting pulse widths that are output to the valves associated with the R groups, respectively, wherein at least one of the R predefined flow ratios is different than another one of the R predefined flow ratios.

In other features, each of the plurality of injector assemblies further includes a pressure sensor sensing pressure at the valve in each of the plurality of injector assemblies. The method includes adjusting the pulse widths further based on the corresponding pressures. The method includes sensing gas temperature at the valve in each of the plurality of injector assemblies. The method includes adjusting the pulse widths further based on the corresponding gas temperatures.

In other features, the method includes varying the pulse widths further based on at least one of manufacturing differences between the valves in each of the plurality of injector assemblies and non-uniformities of the valves in each of the plurality of injector assemblies. The method includes regulating pressure inside the manifold. Each of the plurality of injector assemblies further includes a restricted orifice. Each of the plurality of injector assemblies further includes a bypass valve having an inlet connected to an inlet of the valve.

In other features, the method includes sensing pressure at the valve in each of the plurality of injector assemblies and adjusting the pulse widths of the valves and the bypass valves further based on the corresponding pressures. The method includes sensing gas temperature at the valve in each of the plurality of injector assemblies and adjusting the pulse widths of the valves and the bypass valves further based on the corresponding gas temperatures.

In other features, the method includes varying the pulse widths further based on a desired overlap of the valve and the bypass valve for each of the plurality of injector assemblies. The method includes varying doses output by the plurality of injector assemblies to provide spatial skew.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 10-13 are flowcharts illustrating methods for operating the injectors according to the present disclosure;

FIG. 14 is a functional block diagram illustrating an example of a processing chamber including a dose controller and multiple injectors that compensate for upstream and/or downstream skew according to the present disclosure;

FIG. 15 is a functional block diagram of an example of a processing chamber including a dose controller and multiple injectors that compensate for upstream skew according to the present disclosure;

FIG. 16 is a flowchart illustrating an example of a method for processing a substrate to compensate for upstream skew of the incoming substrate according to the present disclosure;

FIGS. 17A and 17B are functional block diagrams of an example of a processing chamber including a dose controller and multiple injectors that compensate for downstream skew according to the present disclosure;

FIGS. 20 and 21 are timing diagrams illustrating examples of injector timing for spatial skew according to the present disclosure;

In the drawings, reference numbers may be reused to identify similar and/or identical elements.

DETAILED DESCRIPTION

Figure 1:
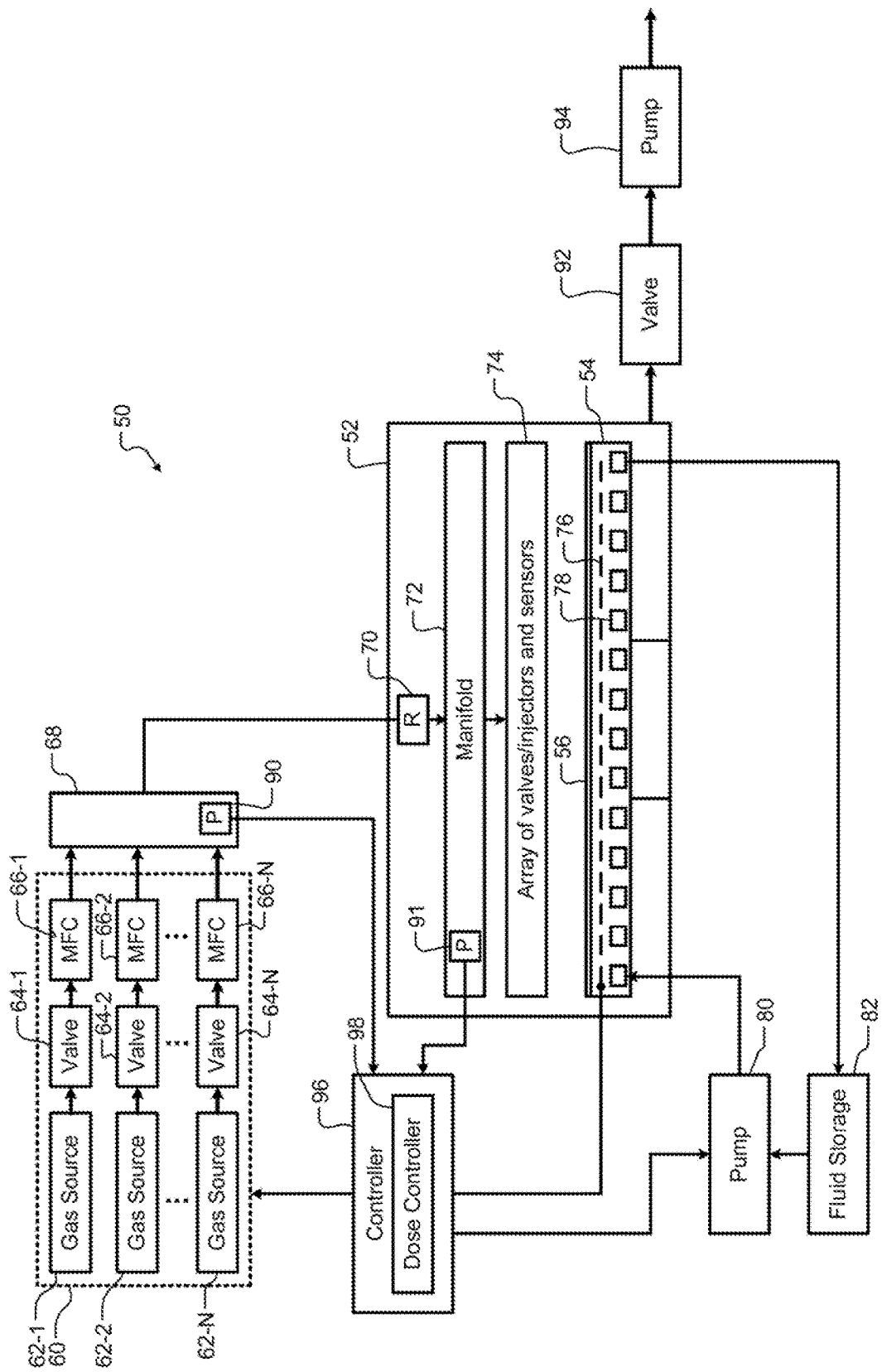
FIG. 1 is a functional block diagram of an example of a substrate processing system including a multi-injector showerhead according to the present disclosure.

To reduce latency, a gas delivery system according to the present disclosure supplies gas into the processing chamber using a plurality of gas injectors and a common gas supply manifold. The injectors are arranged at various locations inside the processing chamber above the substrate. There are often manufacturing differences between the same types of gas injectors from the same manufacturer. When the dose (or pulse width) of the injectors is relatively short, the manufacturing differences can cause significant dose variations and/or non-uniformity even when the same pulse width is used. Reducing manufacturing tolerances sufficiently to eliminate dosing differences between the valves has proven to be cost prohibitive.

The dose per pulse is also dependent upon a previous pulse width and/or flow rate. In systems performing ALD and ALE, precise dose control is required and very fast switching between different gas mixtures is performed. In some examples, the doses are supplied and the substrate is exposed to the doses during periods that are less than 2 seconds, 1 second, 0.5 seconds or even shorter durations. Furthermore, dose variations due to prior pulse widths or flow is unacceptable given the frequency of gas mixture switching.

Systems and methods according to the present disclosure allow injection of precise gas doses into a processing chamber using multiple injectors located inside of the processing chamber. The injectors can be operated with choked or unchoked flow conditions. When operated in choked flow conditions, flow from the injector is not affected by downstream pressure. When operated in unchoked flow conditions, flow from the injector may be affected by downstream pressure.

The pulse widths can be varied by a dose controller to compensate for manufacturing differences between injectors and/or for other non-uniformities. In some examples, the non-uniformities may arise due to dependencies on immediately prior injector doses and flows, etc. The dose controller can also be used to provide time varying gas concentrations, gas doses having spatial skew and/or gas doses having time-based skew.

When the injectors are operated in the choked flow condition, flow is not affected by downstream pressure. In this example, each of the injectors includes a variable flow restrictor (VFR) and a fixed flow restrictor (FFR). For example, a shut off valve and a restricted orifice can be used. The injectors are supplied by a common supply manifold. In some examples, manifold pressure is measured in the manifold and/or at the injectors with pressure sensors having a sampling rate that is higher than a switching frequency of the injectors. In some examples, manifold pressure is measured in the manifold and/or at the injectors with pressure sensors having a sampling rate that is at least 10 times higher than a switching frequency of the injectors. In some examples, gas temperature is measured at each of the injectors.

The pressures and temperatures for each of the injectors are output to a dose controller. The dose controller calculates pulse widths for the valve in each of the injectors to provide an accurate mass flow rate as determined by a flow setpoint and a flow function for the injector flow. The flow function is based on manifold pressure, gas temperature at the injector, geometrical parameters and/or empirical test data. In some examples, a pulse width for a dose is defined without gas state conditions and is based a combination of a desired dose, and/or empirical data. In some examples, pressure inside the manifold is actively controlled by a pressure regulator.

When the injectors are operated in an unchoked flow condition, flow may be affected by downstream pressure. In this example, the injectors include a valve and a bypass valve. In some examples, manifold pressure at the manifold or the valves is measured with pressure sensors having a high sampling rate. In some examples, gas temperature is measured at the injector.

The measured pressures and temperatures are output to a dose controller. The dose controller calculates pulse widths for the valves in each injector to provide an accurate mass flow rate as determined by a flow setpoint and a flow function for the injector flow. The flow function is based on manifold pressure, gas temperature at the injector, desired overlap between the valve and the bypass valve, geometrical parameters and/or empirical test data. In some examples, a pulse width for a dose is defined without gas state conditions and is based a combination of a desired dose, desired overlap between the valve and the bypass valve, geometrical parameters and/or empirical test data. In some examples, pressure inside the manifold is actively controlled by a pressure regulator.

Referring now to FIG. 1, an example of a substrate processing system 50 according to the present disclosure is shown. The substrate processing system 50 includes a processing chamber 52. A substrate support 54 such as an electrostatic chuck (ESC) is arranged in the processing chamber 52. A substrate 56 is arranged on the substrate support 54 during processing.

A gas delivery system 60 includes gas sources 62-1, 62-2, . . . , and 62-N (collectively gas sources 62) that are connected to valves 64-1, 64-2, . . . , and 64-N (collectively valves 64) and mass flow controllers 66-1, 66-2, . . . , and 66-N (collectively MFCs 66). The MFCs 66 control flow of gases from the gas sources 62 to a manifold 68 where the gases mix. An output of manifold 68 is supplied via an optional pressure regulator 70 to a manifold 72. An output of the manifold 72 is input to a multi-injector showerhead 74. While the manifolds 68 and 72 are shown, a single manifold can be used.

In some examples, a temperature of the substrate support 54 may be controlled by resistive heaters 76 and/or coolant channels 78. The coolant channels 78 supply cooling fluid from a fluid storage 82 and a pump 80. Pressure sensors 90, 91 may be arranged in the manifold 68 or the manifold 72, respectively, to measure pressure. A valve 92 and a pump 94 may be used to evacuate reactants from the processing chamber 52 and/or to control pressure within the processing chamber 52.

A controller 96 includes a dose controller 98 that controls dosing provided by the multi-injector showerhead 74. The controller 96 also controls gas delivery from the gas delivery system 60. The controller 96 controls pressure in the processing chamber and/or evacuation of reactants using the valve 92 and the pump 94. The controller 96 controls the temperature of the substrate support 54 and the substrate 56 based upon temperature feedback from sensors (not shown) in the substrate support and/or sensors (not shown) measuring coolant temperature.

Figure 2:
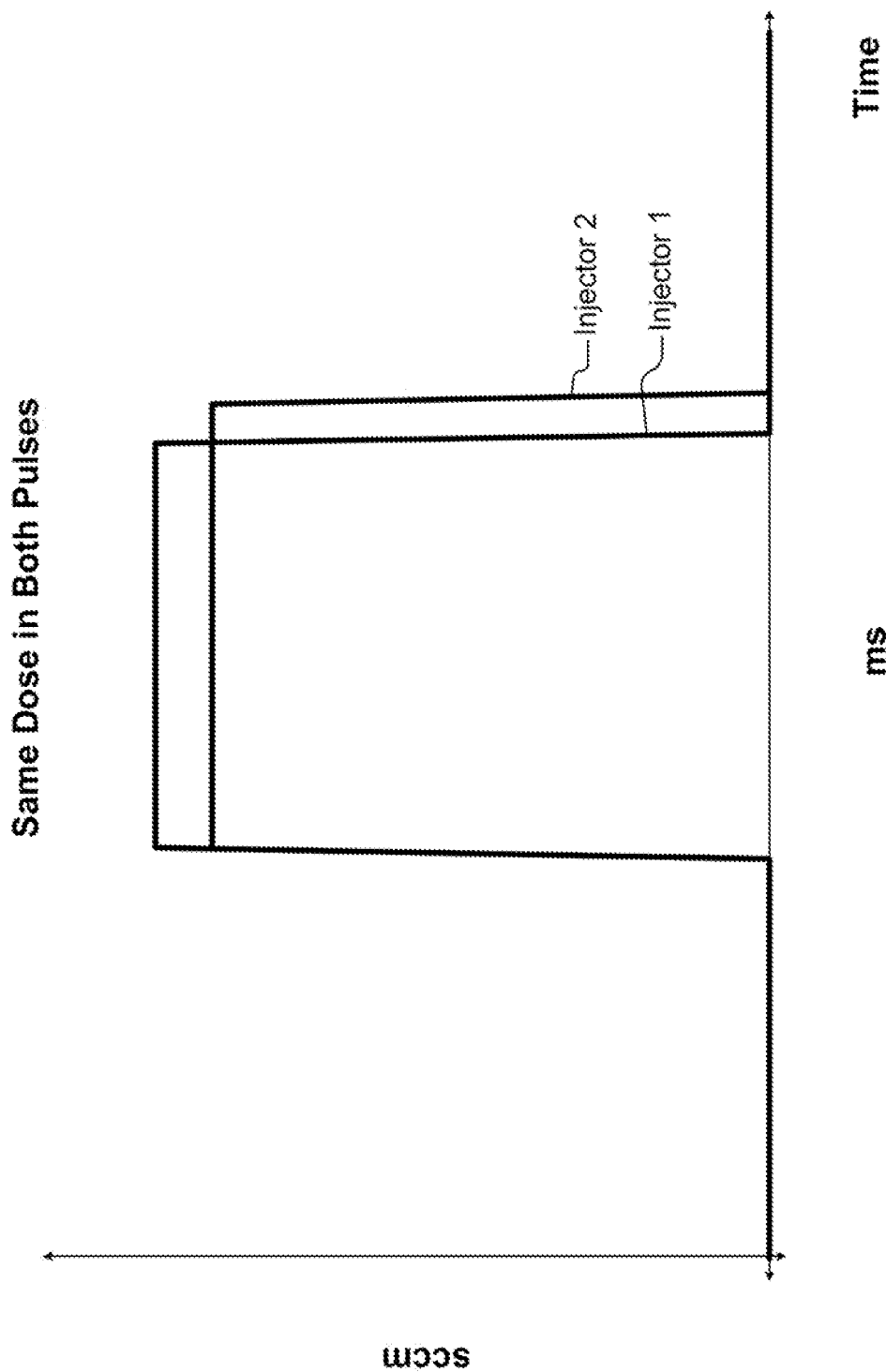
FIG. 2 is a graph showing an example of intentional variation in pulse width to provide approximately the same gas dose with two injectors having manufacturing differences or other non-uniformities according to the present disclosure.

Referring now to FIG. 2, two of the same type of injectors from the same manufacturer may have manufacturing differences and may not provide the same dose when the same pulse width is used—particularly for shorter pulse widths. If the two injectors (identified as injector 1 and injector 2 in FIG. 2) are controlled with the same pulse width, they will produce different doses because injector 1 flows at a higher maximum rate (e.g. standard cubic centimeters per minute (sccm)) than injector 2. According to the present disclosure, when the same dose is desired, different pulse widths are used when controlling injector 1 and injector 2. As used herein, the term same dose refers to dosing within 5%, 3% or 1%. A first pulse width output to injector 1 will be shorter than a second pulse width output to injector 2 to provide the same dose. In other words, the dose controller 98 compensates the pulse widths output to the injectors to account for manufacturing differences between injectors. Similar compensation can be made when the injectors are controlled to provide different dosing. In some examples, the injectors are bench tested to determine the differences in gas dosing. In other examples, the injectors are actuated individually and gas dosing is evaluated in situ in the processing chamber.

Referring now to FIGS. 3 and 4A-4D, the injectors can be arranged in zones and controlled to provide the same dose, the same dose timing, different doses and/or different dose timing. For example, differential dose timing can be used to create a gas wave across a substrate to be processed. In other words, gas doses can be supplied centrally and then sequentially in successive zones in a radially outer direction (or in an opposite direction from edge to center). In some examples, different doses for the individual injectors can be used to eliminate thickness non-uniformity.

Figure 3:
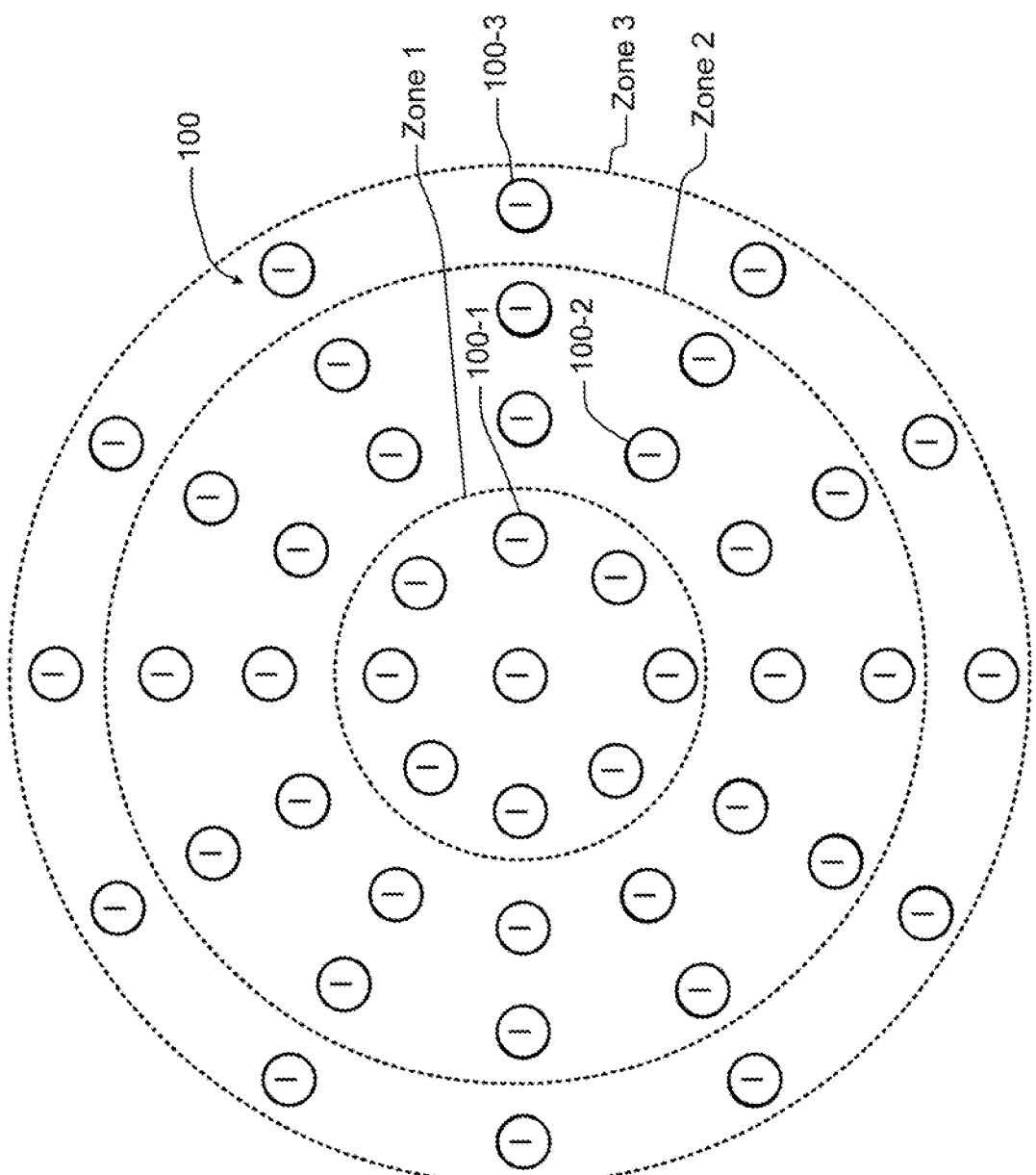
FIG. 3 illustrates an example of an arrangement of injectors in the multi-injector showerhead in multiple zones.
Figure 4D:
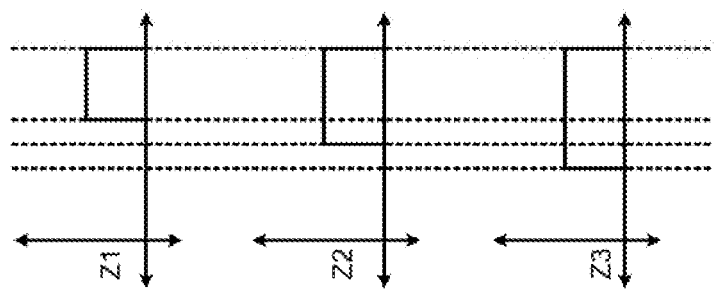
FIGS. 4A-4D are graphs illustrating variations in timing between individual injectors or groups of injectors arranged in zones.

In FIG. 3, a plurality of injectors 100 (e.g. 100-1, 100-2, 100-3) are arranged in P zones (e.g. Zone 1, Zone 2, Zone 3, respectively), where P is an integer greater than zero. In FIG. 4A, the injectors 100 in the plurality of zones provide the same dose and the same dose timing. In FIG. 4B, the injectors 100 in the plurality of zones provide the same dose with offset timing. The injectors 100 in FIGS. 4A and 4B are individually compensated to provide the same dose as described above.

Figure 4C:
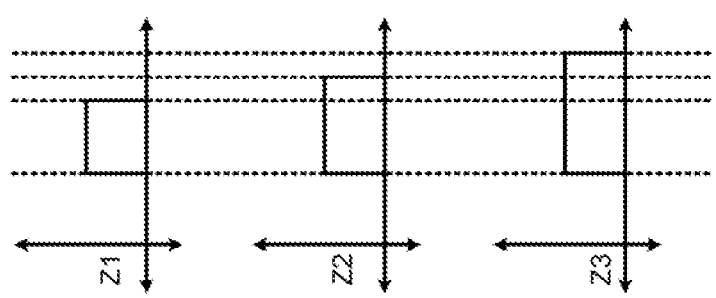
Figure 4B:
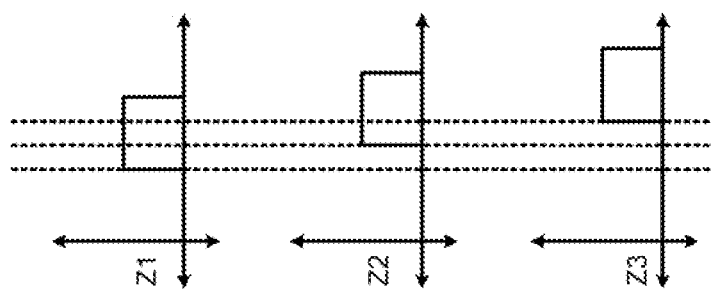
Figure 4A:
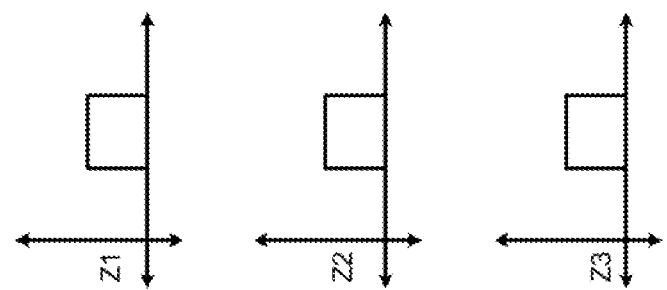

In FIG. 4C, the injectors 100 in the plurality of zones provide different doses and start at the same time. In FIG. 4D, the injectors 100 in the plurality of zones provide different doses and end at the same time. The injectors 100 in FIGS. 4C and 4D are individually compensated to provide the different doses as described above.

Figure 5:
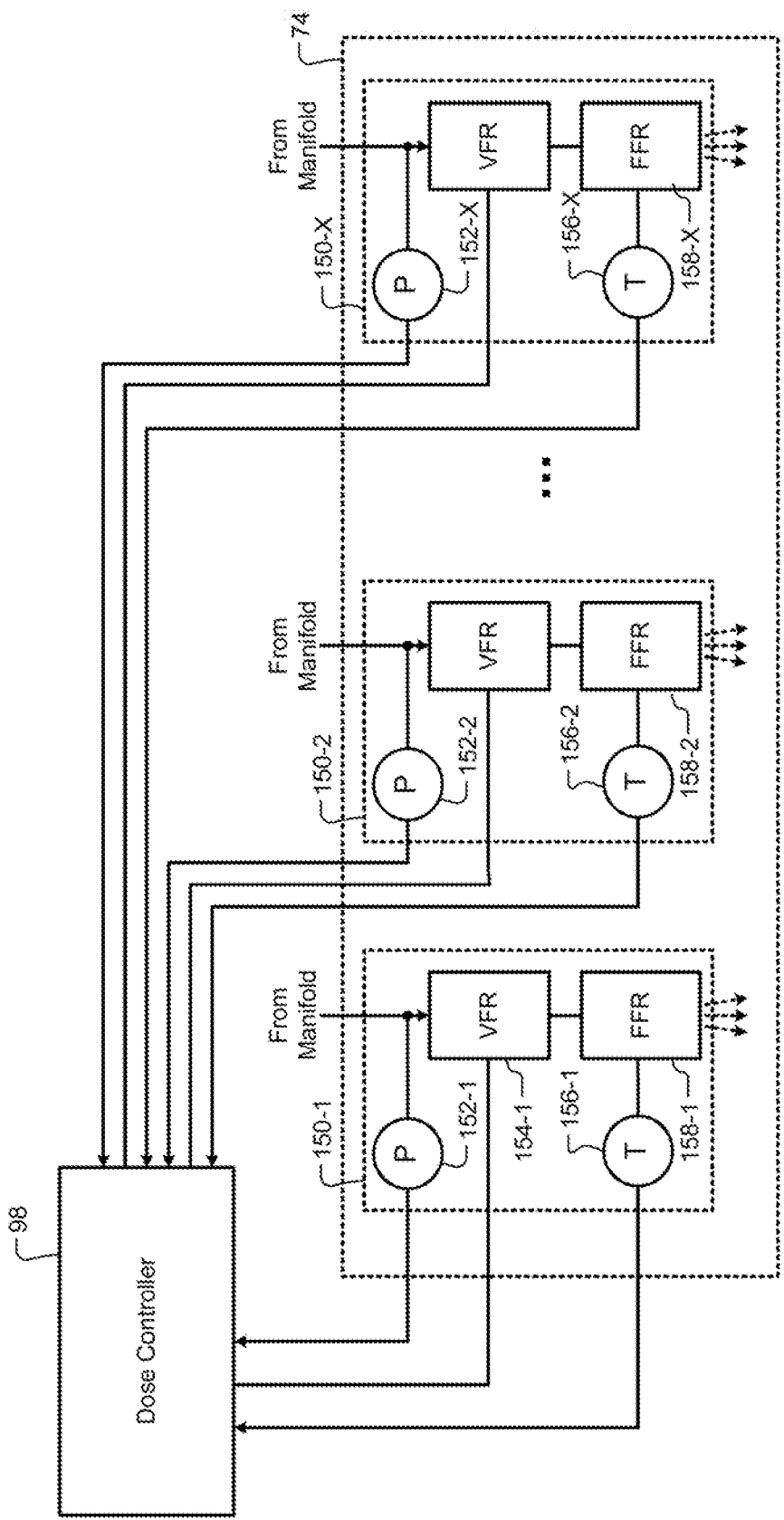
FIG. 5-7 are functional block diagrams of examples of the multi-injector showerhead according to the present disclosure.
Figure 6:
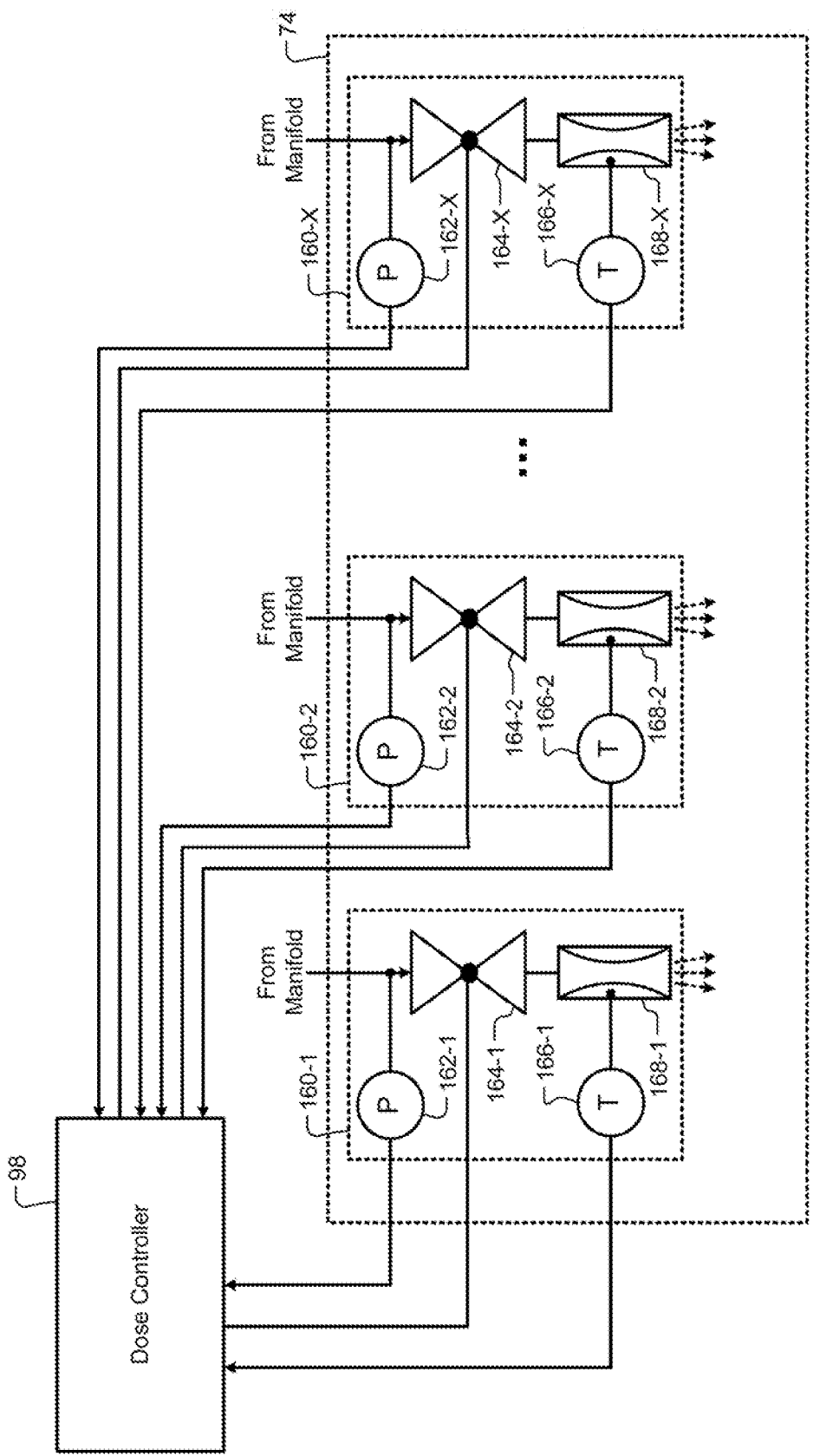
Figure 7:
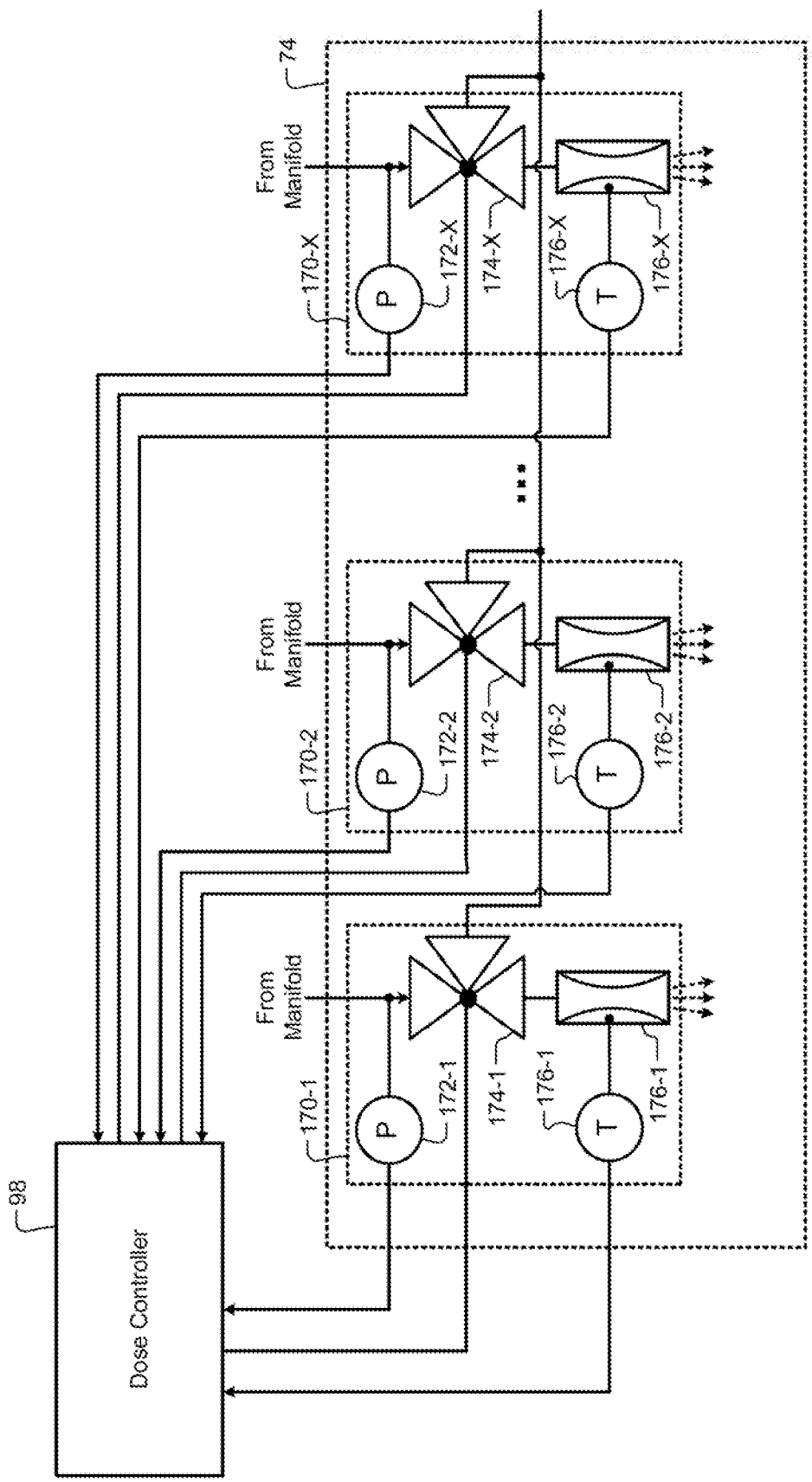

Referring now to FIGS. 5-7, various arrangements of the multi-injector showerhead 74 are shown. In FIG. 5, the multi-injector showerhead 74 is shown to include injector assemblies 150-1, 150-2, . . . , and 150-X (collectively injector assemblies 150) (where X is an integer greater than one). The injector assemblies 150 include pressure sensors 152-1, 152-2, . . . , and 152-X (collectively pressure sensors 152), respectively, to sense a pressure at an inlet of variable flow restrictors (VFR) 154-1, 154-2, . . . , and 154-X (collectively VFRs 154). A pulse width of the VFRs 154 is controlled by the dose controller 98 as will be described further below. The injector assemblies 150 further include temperature sensors 156-1, 156-2, . . . , and 156-X (collectively temperature sensors 156) that sense gas temperature. In some examples, fixed flow restrictors (FFRs) 158-1, 158-2, . . . , and 158-X (collectively FFRs 158) are connected to outlets of the VFRs 154.

In FIG. 6, the multi-injector showerhead 74 includes injector assemblies 160-1, 160-2, . . . , and 160-X (collectively injector assemblies 160) (where X is an integer greater than one) including pressure sensors 162-1, 162-2, . . . , and 162-X (collectively pressure sensors 162), respectively, to sense a pressure at an inlet of valves 164-1, 164-2, . . . , and 164-X (collectively valves 164). A pulse width of the valves 164 is controlled by the dose controller 98 as will be described further below. The injector assemblies 160 further include temperature sensors 166-1, 166-2, . . . , and 166-X (collectively temperature sensors 166) that sense gas temperature. In some examples, fixed orifices 168-1, 168-2, . . . , and 168-X (collectively fixed orifices 168) are connected to an outlet of the valves 164.

In FIG. 7, the multi-injector showerhead 74 are shown to include injector assemblies 170-1, 170-2, . . . , and 170-X (collectively injector assemblies 170) (where X is an integer greater than one) including pressure sensors 172-1, 172-2, . . . , and 172-X (collectively pressure sensors 170), respectively. The pressure sensors 172 sense pressure at an inlet of valves 174-1, 174-2, . . . , and 174-X (collectively valves 174) and bypass valves 175-1, 175-2, . . . , and 175-X (collectively bypass valves 175). Pulse widths of the valves 174 and the bypass valves 175 are controlled by the dose controller 98 as will be described further below. The injector assemblies 170 further include temperature sensors 176-1, 176-2, . . . , and 176-X (collectively temperature sensors 176) that sense gas temperature. In some examples, fixed orifices 178-1, 178-2, . . . , and 178-X (collectively fixed orifices 178) are arranged at an output of the valves 174.

Figure 8:
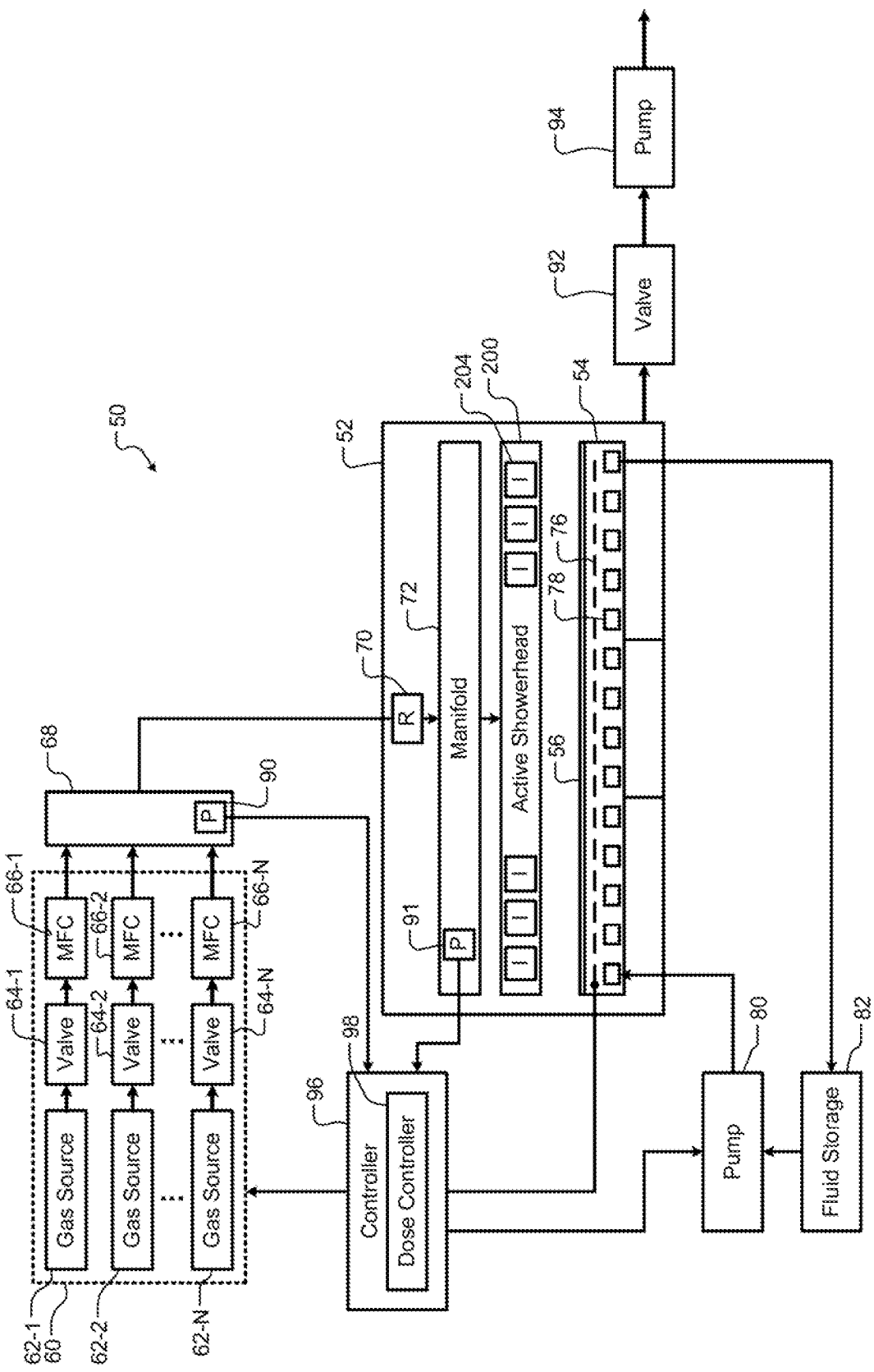
FIG. 8 is a functional block diagram of an example of a substrate processing system including an active showerhead according to the present disclosure.
Figure 9:
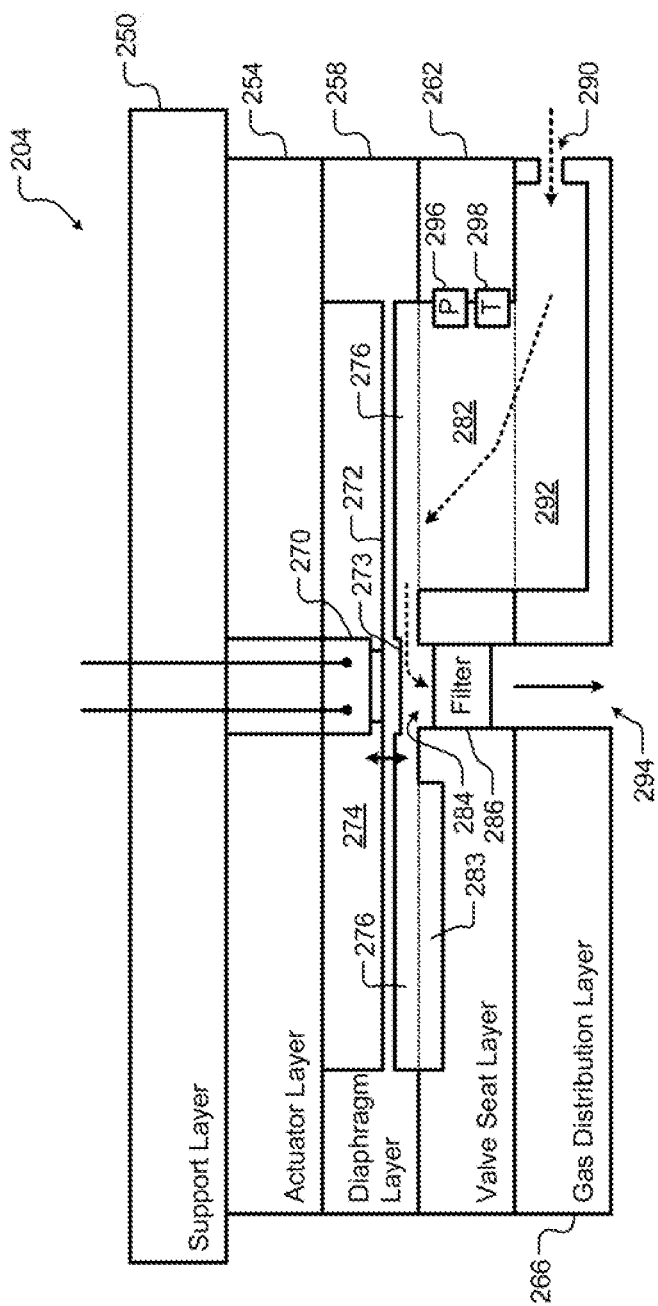
FIG. 9 is a functional block diagram of an example of an active injector in the active showerhead.

Referring now to FIGS. 8-9, there are other ways of implementing the multi-injector showerhead 74 of FIG. 1. In FIG. 8, an active showerhead 200 includes multiple injectors 204. Examples of active showerheads 200 are shown and described further in commonly-assigned U.S. patent application Ser. No. 15/346,920, filed on Nov. 9, 2016, which is hereby incorporated by reference in its entirety. In FIG. 9, an example of an injector 204 in the active showerhead 200 is shown to include a support layer 250, an actuator layer 254, a diaphragm layer 258, a valve seat layer 262 and a gas distribution layer 266. As can be appreciated, the active showerhead 200 includes multiple injectors. In some examples, the injectors of the active showerhead 200 are formed in substrate layers such as semiconductor wafers. The substrate layers can be formed and then bonded together to form the injector.

The actuator layer 254 includes an actuator 272 that selectively moves a diaphragm 272. In some examples, the diaphragm includes an optional projection 273. The diaphragm 272 is moved up-and-down as shown by arrows to allow gas flow or to prevent gas flow. The diaphragm layer 258 defines cavities 274 and 276. The valve seat layer 262 defines cavities 282 and 283. The gas distribution layer 266 defines an opening 290 and cavities 292 and 294. In some examples, a filter 286 is arranged in the cavity 294. Gas from a manifold or other gas source is supplied to the opening 290. When the diaphragm 272 is open as shown in FIG. 9, the gas flows through the cavity 292, the cavity 282, the cavity 276, through the filter 286 (if used), and through the cavity 294 into the processing chamber. The actuator 272 moves the diaphragm 272 into a closed position by biasing a bottom surface thereof (the projection 273 if used) into an inlet 284. In some examples, pressure and temperature sensors 296 and 298, respectively, are used to measure pressure and temperature in the cavity 282.

Referring now to FIGS. 10-13, methods for operating the injectors are shown. In FIG. 10, a method 300 includes determining a desired gas dose for each injector of a plurality of injectors at 310. At 320, pressure is measured at the manifold or at the gas injector. At 330, gas temperature is measured at the gas injector. At 340, pulse width or duration is adjusted for each injector based on a flow relationship to provide the desired gas dose. The flow relationship is a function of measured pressure and temperature, overlap between bypass valve and the flow valve, geometrical parameters and/or empirical data.

In FIG. 11, dose adjustment is performed in a method 350 without full knowledge of the gas state. At 352, a desired gas dose for each injector is determined. At 354, pulse width or duration is adjusted for each injector based on a flow relationship to provide the desired gas dose. The flow relationship is a function of overlap between bypass valve and the flow valve, geometrical parameters and/or empirical data.

In FIG. 12, a method 400 includes determining a desired gas dose for each injector of a plurality of injectors at 410. At 420, pressure is measured at the manifold or at the gas injector. At 430, gas temperature is measured at the gas injector. At 440, pulse width or duration is adjusted for each injector based on a flow relationship to provide the desired gas dose. The flow relationship is a function of measured pressure and temperature, overlap between bypass valve and the flow valve, geometrical parameters and/or empirical data.

In FIG. 13, dose adjustment is performed in a method 450 without full knowledge of the gas state. The method 450 includes determining a desired gas dose for each injector of a plurality of injectors at 460. At 470, pulse width or duration is adjusted for each injector based on a flow relationship to provide the desired gas dose. The flow relationship is a function of overlap between the bypass valve and the flow valve, geometrical parameters and/or empirical data.

Referring now to FIG. 14, a substrate processing system 480 including one or more processing chambers including multiple injectors (such as those described above) that provide compensation for upstream and/or downstream substrate non-uniformity or skew (collectively referred to herein as skew). Skew data may correspond to substrate film with a center region that is thicker than an edge region, an edge region that is thicker than a center region, side to side variations, or other variations from a flat surface. The skew may be caused by an upstream process or anticipated skew that is expected from a downstream process. The skew data can be generated for the same substrate that is to be processed, test substrates, modelling, and/or one or more substrates that preceded the substrate to be processed. The skew data can be generated as a function of two or more substrates (such as an average, moving average, a statistical function, etc.).

A processing chamber 482 performs substrate treatment such as deposition, etching or other substrate treatment on a substrate. In some examples, the substrate treatment that is performed creates skew that is compensated during downstream processing. In some examples, a metrology station 484 is located downstream from the processing chamber 482 to perform one or more measurements on the substrate after processing and to generate metrology data for the substrate. In some examples, the metrology station 484 generates skew data based on film thickness measurements and/or generates a surface model for the substrate. The metrology station 484 outputs the metrology data to a processing chamber 488 that is located downstream. The processing chamber 488 includes multiple injectors and performs dose control as described herein to compensate for the skew. The processing chamber 488 uses the metrology data to determine the amount of compensation that is needed to offset the skew that was introduced by the processing chamber 482. In other examples, the metrology station 484 is omitted and compensation is performed based on modeling, prior metrology measurements made during process setup or other data.

For example, the processing chamber 482 may perform deposition of film or etching of film. In some examples, the processing chamber 482 performs deposition of film that is thicker at the center or edge of the substrate. In some examples, the processing chamber 482 performs etching that removes more film at the center or edge of the substrate than is desired. The metrology data detects the skew and the dose controller associated with the processing chamber 488 compensates for the skew.

After the substrate is processed in the processing chamber 488, the substrate may be further processed in a processing chamber 490 that is located downstream therefrom. After processing in the processing chamber 490, metrology data is generated by the metrology station 492. The metrology data is fed back to the processing chamber 488 to allow pre-compensation for downstream skew. In other examples, the metrology station 484 is omitted and compensation is performed based on modeling, prior metrology measurements made during setup or other data.

Referring now to FIG. 15, the processing chamber 488 includes a controller 502 with a dose controller 504. The dose controller 504 further includes a compensation module 512 that receives skew data from the metrology station 484, a data store 508 or another data source. The compensation module 512 further receives a desired spatial map 510 for the incoming substrate. The compensation module 512 generates skew compensation data that is output to a dose mapping module 514. The dose mapping module 514 compensates a base dose map 516 based on the skew compensation data from the compensation module 512. For example, when additional or decreased etching or deposition is desired in a particular area, a local dose or duration of exposure to precursor or etching gas, respectively, can be increased or decreased relative to other areas. The dose mapping module 514 outputs a compensated dose map to an injector control module 520, which controls the injectors accordingly.

Referring now to FIG. 16, a method 530 for processing a substrate using multiple injectors that are controlled using skew data to compensate for skew of the incoming substrate is shown. At 540, skew data for the substrate (such as a spatial map or set of parameters) are received for the incoming substrate (or for a typical or expected incoming substrate). At 544, the skew data is compared to a desired spatial map or set of parameters. At 548, compensation for upstream skew is determined. At 564, a compensated dose map is generated based on the base dose map and the compensation.

Figure 17B:
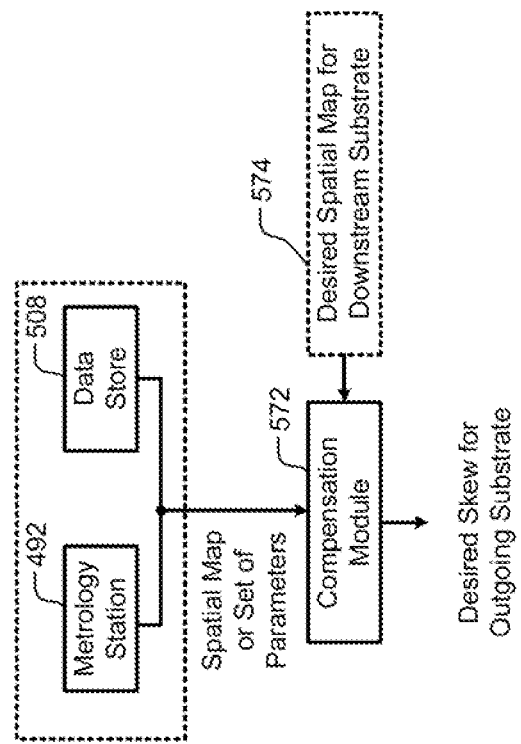

Referring now to FIGS. 17A and 17B, an example of a processing chamber including injectors that are controlled to pre-compensate for skew caused by one or more downstream processes is shown. In FIG. 17A, the processing chamber 488 includes a controller 552 with a dose controller 554. The dose controller 554 includes a dose mapping module 560 that receives a desired skew 558 to pre-compensate the outgoing substrate for skew caused by one or more downstream processes. The dose mapping module 560 compensates a base dose map 564 based on the desired skew for the outgoing substrate to pre-compensate for downstream skew. The dose mapping module 560 outputs the compensated dose map to an injector control module 570.

In FIG. 17B, an example of a system for generating the desired skew for the outgoing substrate is shown. The dose controller 554 further includes the metrology station 492 or a data store 508 that outputs a spatial map or a set of parameters to a compensation module 572. The compensation module 572 further receives a desired spatial map for the downstream substrate at 574. The compensation module 572 generates the desired skew for the outgoing substrate. As can be appreciated, the system shown in FIG. 17B can be combined with the system shown in FIG. 17A. Furthermore, the systems shown in FIGS. 17A and 17B can be combined with the system shown in FIG. 15.

Figure 18:
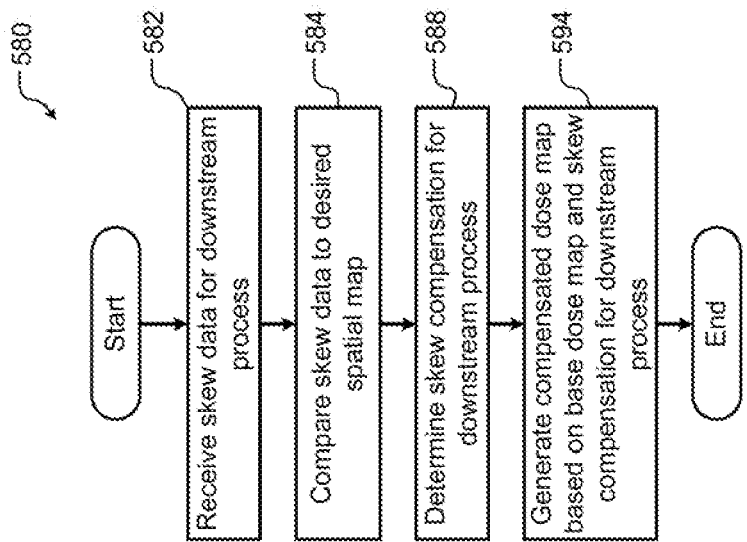
FIG. 18 is a flowchart illustrating an example of a method for processing a substrate to compensate for downstream skew according to the present disclosure.

Referring now to FIG. 18, a method 580 for processing a substrate using injectors that compensate the outgoing substrate to offset skew caused by one or more downstream processes is shown. At 582, skew data is received for one or more downstream processes. At 584, the skew data is compared to a desired spatial map. At 588, compensation is determined to pre-compensate for the skew of the one or more downstream processes. At 594, a compensated dose map is generated based on a base dose map and compensation for the one or more downstream processes.

Figure 19A:
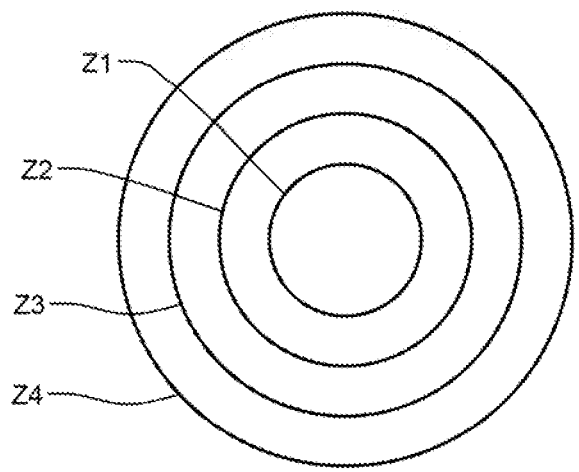
FIGS. 19A-19C illustrate examples of ways for partitioning of the injectors into one or more groups to enable spatial or temporal skew compensation according to the present disclosure.
Figure 19B:
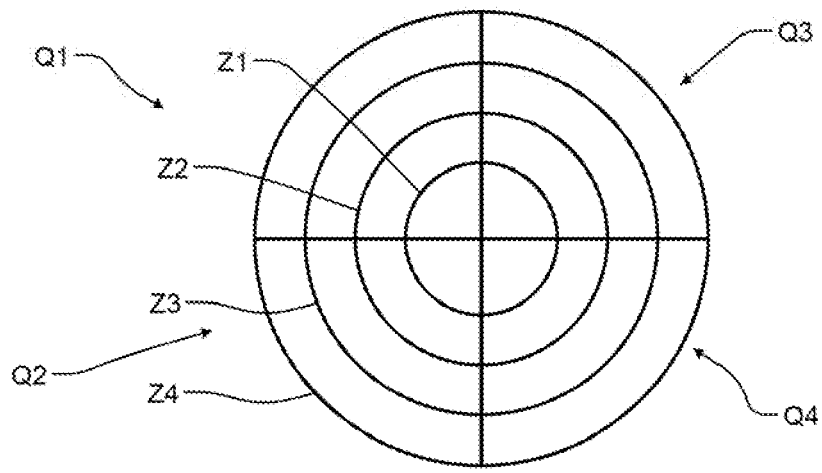
Figure 19C:
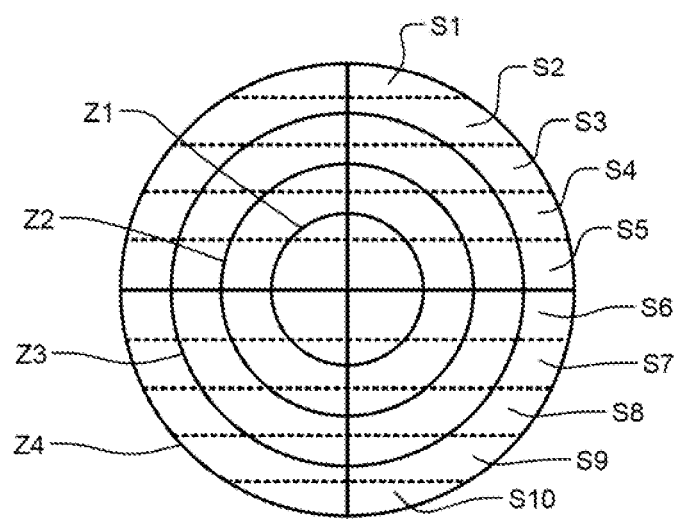

Referring now to FIGS. 19A-19C, the injectors can be addressed individually and/or arranged into groups to define various types of zones or zone shapes. For example, the groups may correspond to radial zones, pie-shaped zones and/or sliced zones. In FIG. 19A, the injectors are grouped into radial zones Z1, Z2, Z3 and Z4. While four radial zones are shown, additional or fewer numbers of radial zones can be used. In FIG. 19B, the injectors are grouped into the radial zones and/or into pie-shaped zones Q1, Q2, Q3 and Q4. While four pie-shaped zones are shown, additional or fewer pie-shaped zones can be used. In FIG. 19C, slices S1, S2, ..., and S10 are shown that can be used in addition to or instead of the examples in FIGS. 19A and 19B. In some examples, sides of the slices are parallel and abut adjacent slices. An angular orientation or angular offset of the slices can be varied as needed relative to a slot in the substrate or to a predetermined reference in the processing chamber. The slices may be used to accommodate side-to-side skew.

Referring now to FIGS. 20 and 21, examples of timing diagrams illustrating injector timing for spatial-based skew by individual injectors or groups of injectors is shown. One or more of the timing diagrams in FIG. 20 provide different injector dose control timing to individual injectors or groups of injectors. Individual injectors or groups of injectors associated with timing profile A have slowly decreasing pulse widths as a function of time. Individual injectors or groups of injectors associated with timing profiles B and C have pulse widths that decrease at a slightly faster rate as compared to timing profile A. Individual injectors or groups of injectors associated with timing profile D have fixed pulse widths during the corresponding periods. The variable pulse widths associated with the individual injectors or groups of injectors allow precise control of spatial and/or temporal dosing.

In FIG. 21, the timing profiles can be used to produce different spatial patterns. Injectors or groups of injectors associated with timing profile D have fixed pulse widths during the corresponding periods. Injectors or groups of injectors associated with timing profiles B and C have about ½ the duration of the pulses in timing profile D. Injectors or groups of injectors associated with timing profile A have a similar pulse width as timing profiles B and C for some time periods and other time periods are skipped. The variable pulse widths associated with the individual injectors or groups of injectors allow precise control of spatial and/or temporal dosing.

Figure 22:
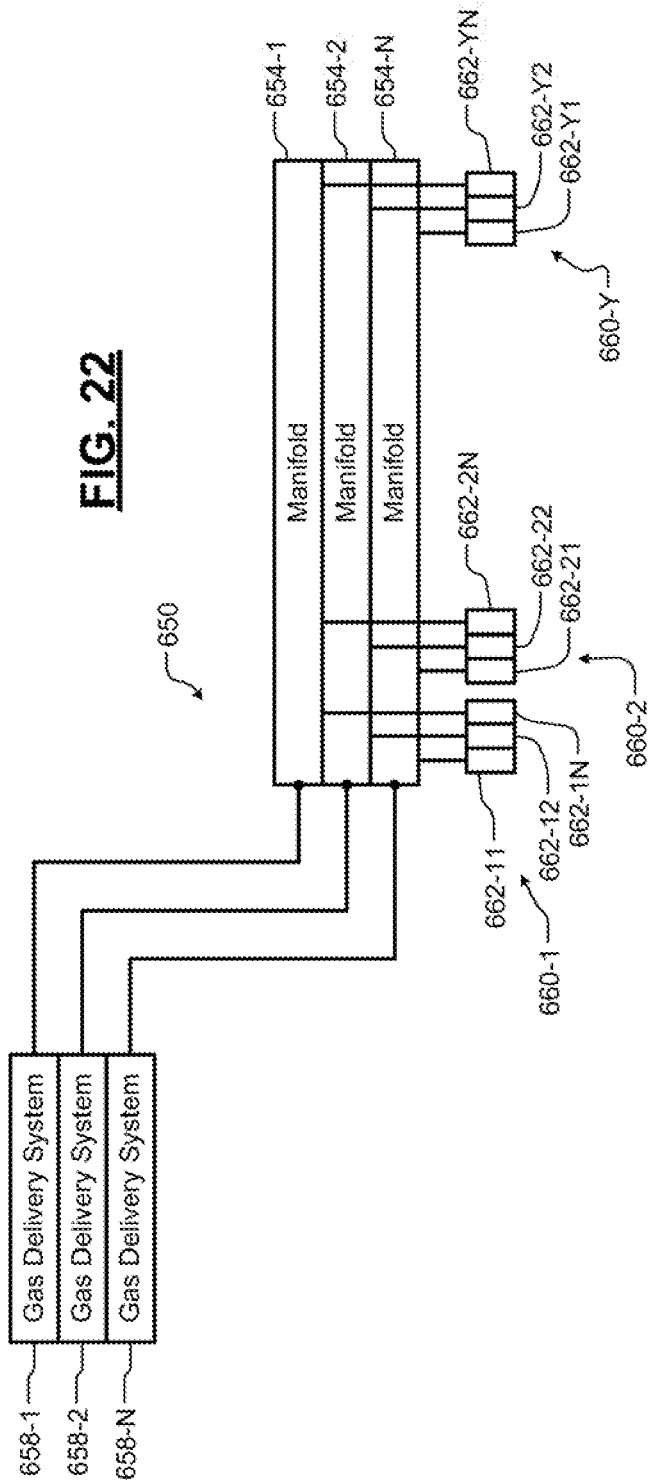
FIG. 22 is a partial functional block diagram of an example of a processing chamber including multiple manifolds to supply different gas mixtures to injector assemblies to enable time-based skew according to the present disclosure.

Referring now to FIG. 22, a portion of a processing chamber 650 is shown to include multiple manifolds 654-1, 654-2, ..., and 654-N (collectively manifolds 654) and gas delivery systems 658-1, 658-2, ... 658-N (collectively gas delivery systems 658) where N is an integer greater than one. The manifolds 654 supply different gas mixtures to groups of injector assemblies 660-1, 660-2, ..., and 660-Y (collectively groups of injector assemblies 660) where Y is an integer greater than one. While one gas delivery system is shown per manifold, additional or fewer gas delivery systems can be used.

As will be described further below, the injector assemblies 660 can be configured to create temporal skew. Each of the groups of injector assemblies 660-1, 660-2, ..., and 660-Y includes N injectors 662-11, 662-12, ..., and 662-YN. Each of the N injectors in the groups of injector assemblies 660 is connected to one of the N manifolds 654-1, 654-2, ..., and 654-N, respectively. The arrangement allows the gas mixtures supplied to the N manifolds 654 to be delivered to each of the groups of injector assemblies 660.

Figure 23:
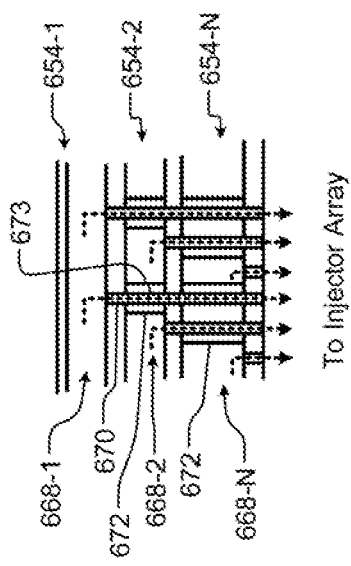
FIG. 23 is a cross-sectional view of an example of the manifolds in FIG. 22 according to the present disclosure.

Referring now to FIG. 23, each of the manifolds 654-1, 654-2, ..., and 654-N defines a plenum 668-1, 668-2, ..., and 668-N (collectively plenums 668) and includes a plurality of through holes 670. In some examples, the plenums 668 are generally shaped like a flat cylinder. To maintain separation of gas mixtures from the plenum 668-1, posts 672 with corresponding aligned through holes 673 are arranged in lower plenums 668-2 ... 668-N to allow the gas mixture in the plenum 668-1 to travel through the through holes 670 and 673 to reach a corresponding injector without intermixing in the plenums 668-2 ... 668-N. A similar approach is used for other ones of the plenums 668. While a specific arrangement of manifolds is shown, other manifold arrangements can be used.

Figure 24:
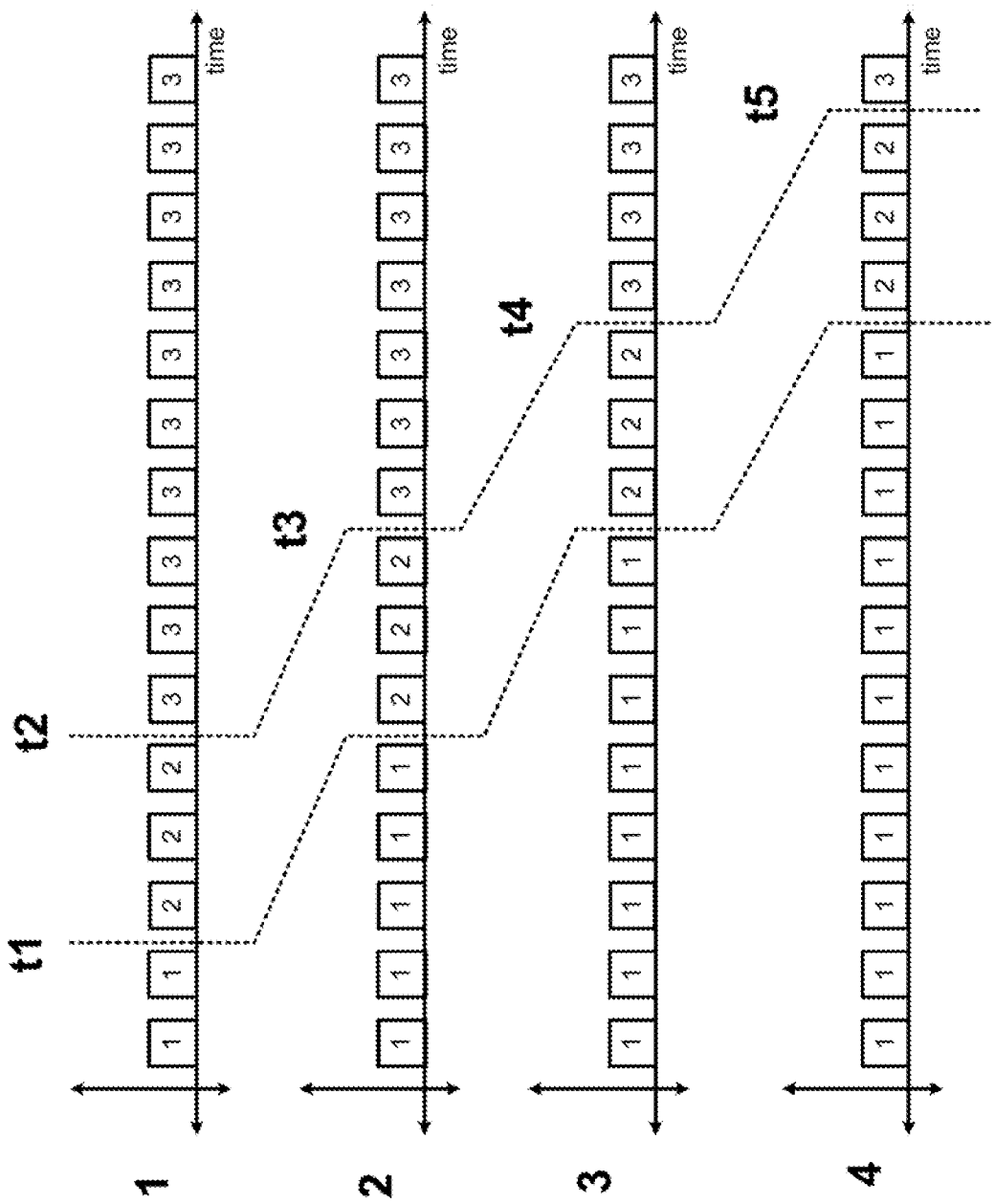
FIG. 24 is a timing diagram illustrating an example of temporal skew according to the present disclosure.

Using the processing chamber shown in FIGS. 22-23, temporal skew can be performed. An example of temporal skew is shown in FIG. 24. In first locations 1 (including one or more injector assemblies), the gas mixture is switched from a first gas mixture 1 to a second gas mixture 2 at time t1 and then to a third gas mixture 3 at time t3. In second locations 2 (including one or more injector assemblies), the gas mixture is switched from a first gas mixture 1 to a second gas mixture 2 at time t2 and then to a third gas mixture 3 at time t4. In third locations 3 (including one or more injector assemblies), the gas mixture is switched from a first gas mixture 1 to a second gas mixture 2 at time t3 and then to a third gas mixture 3 at time t4. In a fourth location 4 (including one or more injector assemblies), the gas mixture is switched from a first gas mixture 1 to a second gas mixture 2 at time t4 and then to a third gas mixture 3 at time t5.

For example, the first locations 1 may correspond to a central zone, and locations 2-4 may correspond to increasing radial zones around the central zone (although the same approach can be used for other groups of injectors having other shapes). As can be appreciated, the gas mixtures that are used will depend on the process and may include deposition gas mixtures, etch gas mixtures, purge gas, or other gas mixtures. For example, the gas mixture 1 may include a first precursor for an ALD or ALE process, the second gas mixture may include purge gas, and the third gas mixture may include a second precursor for the ALD or ALE process.

Figure 25:
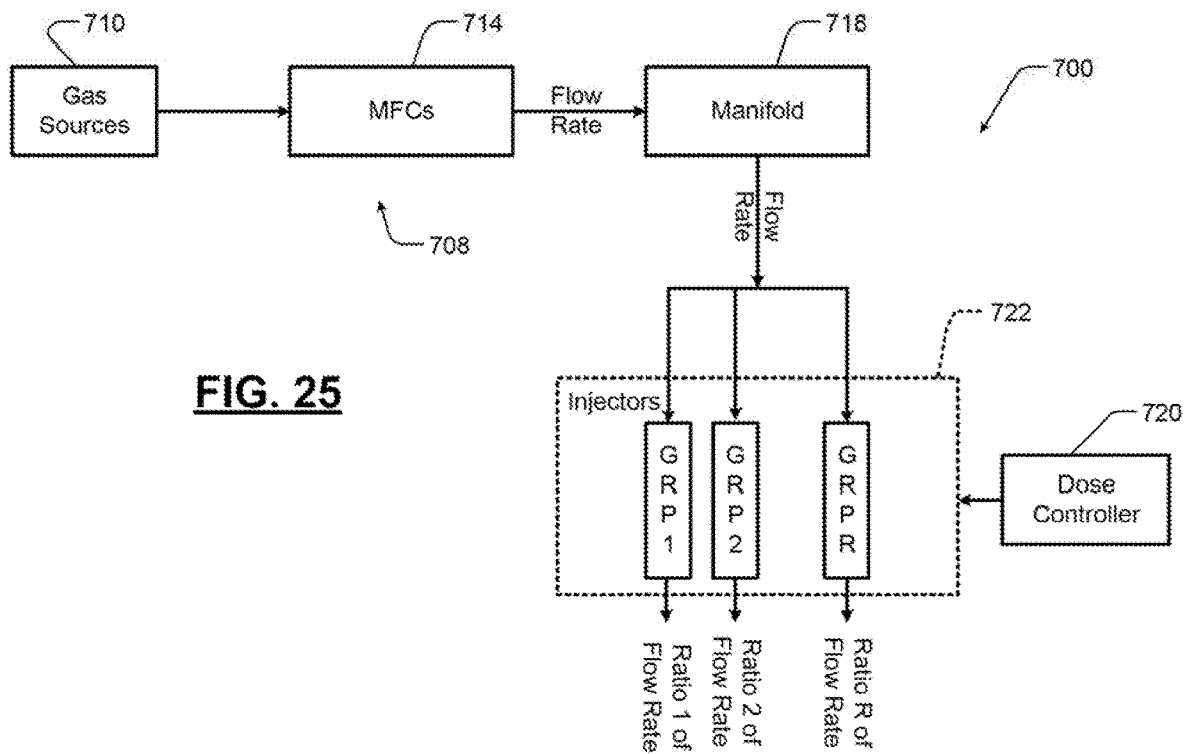
FIG. 25 is a partial functional block diagram of an example of a processing chamber with a dose controller and multiple injectors that are grouped and controlled to provide predefined ratios of a main flow rate according to the present disclosure.

Referring now to FIG. 25, a processing chamber 700 includes multiple injectors 722 that are grouped in various ways as described herein. The injectors 722 are controlled by a dose controller 720 to provide predefined ratios of a main flow rate. The main flow rate is supplied by a gas delivery system 708 including gas sources 710 and MFCs 714 to a manifold 718. In the example shown in FIG. 25, the injectors 722 are divided into R groups (GRP 1, GRP 2, ... and GRP R) that are associated with R spatial areas of the substrate. Each of the R groups may include the same number or a different number of injectors.

In one example, it is desirable to supply two or more different ratios of a predetermined main flow rate to the R spatial areas of the substrate. For example, etch or deposition processes may require more etch gas or deposition precursor gas to be delivered at center or edge areas as compared to other areas of the substrate. Varying the pulse widths to the injectors in the R groups allows predetermined ratios of the main flow at the manifold 718 to be delivered to the R spatial areas without requiring flow splitters.

Traditionally, gas flowing from the manifold 718 would be split using the flow splitters. In some examples, the flow splitters include sonic nozzles. However, systems using flow splitters take a long time to reach steady state flow conditions. Therefore, flow splitters are difficult to use in processes requiring improved spatial control and/or fast gas exchanges such as ALD and ALE processes.

The injectors associated with the R groups are controlled using R pulse widths to provide R predetermined ratios of the main flow rate supplied to the manifold 718, where R is an integer greater than zero.

For example, all of the R groups can be pulsed using the same pulse widths to supply the same dose (assuming the groups have the same number of injectors). Alternately, two or more different pulse widths can be used to vary the ratios for at least some of the R groups. For example, one of the R groups may be pulsed using ½ of the pulse width of others of the R groups to flow less to the one of the R groups and more to the others of the R groups. In another example, the pulse widths to all of the R groups are varied to provide an increasing spatial profile, a decreasing spatial profile, a bell-shaped profile, an inverted bell-shaped profile or other gas dosing profiles.

Figure 26:
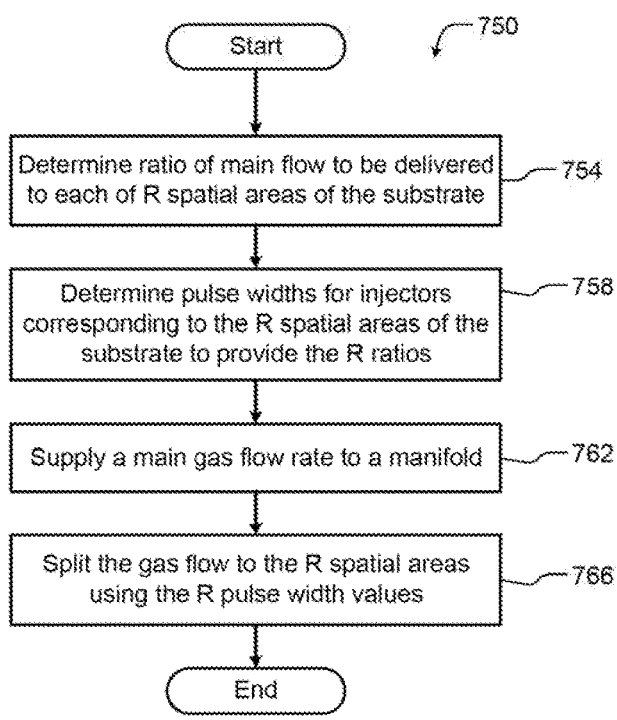
FIG. 26 is a flowchart of an example of a method for splitting a main flow rate into a plurality of gas flows using a plurality of injector groups.

Referring now to FIG. 26, a method 750 for splitting a main gas flow into R gas flows supplied to R spatial areas of a substrate is shown. At 754, a ratio of a main gas flow to be delivered to each of the R spatial areas of the substrate is determined. At 758, pulse widths for the injectors corresponding to the R spatial areas of the substrate are determined to provide the R ratios. At 762, a main gas flow rate is supplied to the manifold. At 766, the gas flow rate supplied to the manifold is split using the R pulse width values corresponding to the injectors in the R spatial areas.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system for treating a substrate, comprising:
   a manifold;
   a plurality of injector assemblies located in a processing chamber,
   wherein each of the plurality of injector assemblies is in fluid communication with the manifold and includes a valve including an inlet and an outlet;
   a dose controller configured to:
     communicate with the valve in each of the plurality of injector assemblies; and
     adjust a pulse width supplied to the valve in each of the plurality of injector assemblies based on at least one of manufacturing differences between the valves in each of the plurality of injector assemblies and non-uniformities of the valves in each of the plurality of injector assemblies to cause a desired dose to be supplied from the valve in each of the plurality of injector assemblies.

2. The substrate processing system of claim 1, wherein each of the plurality of injector assemblies further includes a pressure sensor sensing pressure at the valve in each of the plurality of injector assemblies.

3. The substrate processing system of claim 2, wherein the dose controller is configured to adjust the respective pulse width for each valve based on the corresponding sensed pressure.

4. The substrate processing system of claim 1, wherein each of the plurality of injector assemblies further includes a temperature sensor sensing gas temperature at the valve in each of the plurality of injector assemblies.

5. The substrate processing system of claim 4, wherein the dose controller is configured to adjust the respective pulse width for each valve based on the corresponding sensed gas temperature.

6. The substrate processing system of claim 1, wherein the dose controller is configured to vary the pulse widths based on corresponding locations of the plurality of injector assemblies relative to the substrate.

7. The substrate processing system of claim 1, wherein the dose controller is configured to vary the pulse widths based on corresponding empirical data for the plurality of injector assemblies.

8. The substrate processing system of claim 1, further comprising a pressure regulator to regulate a pressure inside the manifold.

9. The substrate processing system of claim 1, wherein the dose controller is configured to adjust the pulse widths so as to cause the valves to provide approximately the same dose.

10. The substrate processing system of claim 1, wherein the dose controller is configured to adjust the pulse widths so as to cause the valves to provide different doses.

11. The substrate processing system of claim 1, wherein each of the plurality of injector assemblies further includes a restricted orifice.

12. The substrate processing system of claim 1, wherein each of the plurality of injector assemblies further includes a bypass valve having an inlet connected to the inlet of the valve.

13. The substrate processing system of claim 12, wherein each of the plurality of injector assemblies further includes a pressure sensor sensing pressure at the corresponding valve in each of the plurality of injector assemblies, and wherein the dose controller is configured to adjust the pulse widths for the valves and the bypass valves based on the corresponding sensed pressures.

14. The substrate processing system of claim 12, wherein each of the plurality of injector assemblies further includes a temperature sensor sensing gas temperature at the corresponding valve in each of the plurality of injector assemblies, and wherein the dose controller is configured to adjust the pulse widths for the valves and the bypass valves based on the corresponding sensed gas temperatures.

15. The substrate processing system of claim 12, wherein the dose controller is configured to vary the respective pulse width based on a desired overlap of the valve and the bypass valve for each of the plurality of injector assemblies.

16. The substrate processing system of claim 1, wherein the dose controller is configured to vary doses output by the plurality of injector assemblies to provide spatial skew.

* * * * *